US006885038B2

(12) United States Patent  (10) Patent No.: US 6,885,038 B2
Huang et al.  (45) Date of Patent: Apr. 26, 2005

(54) LIGHT-EMITTING POLYMERS AND POLYMER LIGHT-EMITTING DIODES

(75) Inventors: Wei Huang, Shanghai (CN); Zhikuan Chen, Singapore (SG); Soo Jin Chua, Singapore (SG)

(73) Assignees: Agency for Science, Technology and Research (SG); National University of Singapore (SG)

( * ) Notice: Subject to any disclaimer, the term of this patent is extended or adjusted under 35 U.S.C. 154(b) by 0 days.

(21) Appl. No.: 10/174,543

(22) Filed: Jun. 18, 2002

(65) Prior Publication Data

US 2003/0088043 A1 May 8, 2003

(30) Foreign Application Priority Data

Jun. 21, 2001 (SG) .......................................... 200103801

(51) Int. Cl.$^7$ .......................... H01L 33/00; H01L 35/24; H01L 51/00
(52) U.S. Cl. ........................... 257/103; 257/40; 257/79; 257/94; 257/96; 252/301.35; 427/66; 427/387; 427/421; 428/447; 428/448; 528/12; 528/20; 528/36; 528/43
(58) Field of Search ................................. 427/387, 421, 427/66; 524/588; 252/301.35; 257/79, 40, 94, 96, 103; 428/447, 448; 528/12, 20, 36, 43

(56) References Cited

U.S. PATENT DOCUMENTS

| 5,189,136 A | | 2/1993 | Wudl et al. | |
|---|---|---|---|---|
| 5,679,757 A | | 10/1997 | Wudl et al. | |
| 5,731,599 A | * | 3/1998 | Hwang et al. | ................. 257/40 |
| 5,909,038 A | * | 6/1999 | Hwang et al. | ............... 257/103 |
| 6,368,732 B1 | * | 4/2002 | Jin et al. | ..................... 428/690 |
| 6,372,154 B1 | * | 4/2002 | Li | ........................ 252/301.16 |
| 6,602,969 B1 | * | 8/2003 | Ueda et al. | .................. 526/279 |
| 2002/0076576 A1 | * | 6/2002 | Li et al. | ..................... 428/690 |

FOREIGN PATENT DOCUMENTS

JP  2001114873 A  4/2001
WO  WO 99/20711 A1  4/1999

OTHER PUBLICATIONS

Australian Patent Office Search Report of Feb. 20, 2003.
Burroughes, J.H., et al., Light–emitting diodes based on conjugated polymers, Nature, vol. 347, Oct. 11, 1990, pp. 539–541.
Grem, Gabriele, et al., Realization of a Blue–Light–Emitting Device using Poly(p–phenylene), Adv. Mater 4 (1992) No. 1, pp. 36–37.
Fukuda, Masahiko, et al., Synthesis of Fusible and Soluble Conducting Polyfluorene Derivatives and Their Characteristics, J. Polym. Sci. Polym. Chem, 1993, vol. 31, pp 2465–2471.
Berggren, M., et al., Light–emitting diodes with variable colours from polymer blends, Nature, vol. 372, Dec. 1, 1994, pp. 444–446.
Spreitzer, Hubert, et al., Soluble Phelyl–Substituted PPVs— New Materials for Highly Efficient Polymer LEDs, Adv. Mater. 1998, 10, No. 16, pp. 1340–1343.
Gustafsson, G., Flexible light–emitting diodes made from soluble conducting polymers, Nature, vol. 357, Jun. 11, 1992, pp. 477–479.
Burn, P.L., et al., Chemical tuning of electroluminescent copolymers to improve emission efficiencies and allow patterning, Nature, vol. 356, Mar. 5, 1992, pp. 47–49.
Wessling, R.A., The Polymerization of Xylylene Bisdialkyl Sulfonium Salts, J. Polymer Science: Polymer Symp. 72 (1985), pp. 55–66.
Lenz, Robert W., et al., Preparation of Poly(phenylene Vinylene) from Cycloalkylene Sulfonium Salt Monomers and Polymers, J. Polymer Sci: Part A: Polymer Chem., vol. 26 (1988), pp. 3241–3249.
Braun, D., et al., Visible light emission from semiconducting polymer diodes, Appl. Phys. Letter 58 (1991), pp. 1982–1984.
Diaz–Garcia, M.A., et al., Plastic lasers: Semiconducting polymers as a new class of solid–state laser materials, Synthetic Metals 84 (1997), pp. 455–462.
Hagler, T.W., et al., Enhanced order and electronic delocalization in conjugated polymers oriented by gel processing in polyethylene, Physical Review B, vol. 44, No. 16, Oct. 15, 1991, pp. 8652–8666.

(Continued)

Primary Examiner—Jeffrey B. Robertson
(74) Attorney, Agent, or Firm—TraskBritt

(57) ABSTRACT

Disclosed are compounds according to formula (I),

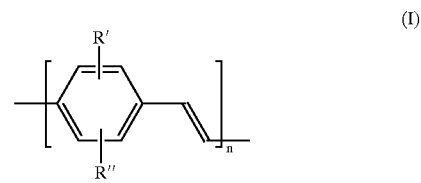

wherein R' and R" are selected from the group consisting of R'=SiR$_1$R$_2$R$_3$ and R"=H; R'=SiR$_1$R$_2$R$_3$ and R"=SiR$_4$R$_5$R$_6$; and R'=Ar$_1$SiR$_1$R$_2$R$_3$ and R"=Ar$_2$SiR$_4$R$_5$R$_6$; R$_1$, R$_2$, R$_3$, R$_4$, R$_5$, and R$_6$ are independently selected from the group consisting of hydrogen, alkyl, alkenyl, alkynyl, aryl, cycloalkyl, cycloalkenyl, cycloalkynyl, arylalkyl, arylalkenyl, and arylalkynyl; Ar$_1$ and Ar$_2$ are independently selected from the group consisting of arylene, arylenealkylene, arylenealkynylene, heteroarylene, heteroarylenealkylene, heteroarylenealkenylene and heteroarylenealkylene; and n is at least 20. Such compounds may be used as an emissive layer in a polymer light-emitting diode (PLED), which itself may be used in electroluminescent devices.

31 Claims, 3 Drawing Sheets

OTHER PUBLICATIONS

Gettinger, C.L., et al., A photoluminescence study of poly(phenylene vinylene) derivatives: the effect of intrinsic persistence length, J. Chem. Phys. 101 (2), Jul. 15, 1994, pp. 1673–1678.

Schwartz, Benjamin J., et al., Ultrafast studies of stimulated emission and gain in solid films of conjugated polymers, Chem. Physics Letters 265, Feb. 7, 1997, pp. 327–333.

Garay, Raul O., et al., Synthesis and Characterization of Poly[2,5–bis(triethoxy)–1,4–phenylene vinylene], J. Polym. Sci.: A1, 33, (1995), pp. 525–531.

Hoger, S., et al., Novel Silicon–Substituted, Soluble Poly(phenylenevinylene)s: Enlargement of the Semiconductor Bandgap, Chem Mater (1994) 6, pp. 171–173.

Zhang, C., et al., Improved Efficiency in Green Polymer Light–Emitting Diodes with Air–Stable Electrodes, J. of Electronic Materials, vol. 23, No. 5 (1994) pp. 453–458.

Andersson, M.R., Electroluminescence from Substituted Poly(thiophenes): from Blue to Near–Infrared, Macromolecules 1995, 28, pp. 7525–7529.

Johansson, D.M. et al., Synthesis and characterization of soluble high molecular weight phenylsubstituted PPV–derivatives, Synthetic Metals 101 (1999), pp. 56–57.

Andersson, M.R., et al., Photoluminescence and electroluminescence of films from soluble PPV–polymers, Synthetic Metals 85 (1997), pp. 1275–1276.

\* cited by examiner

LIGHT-EMITTING POLYMERS AND POLYMER LIGHT-EMITTING DIODES

BACKGROUND OF THE INVENTION

1. Field of the Invention

The present invention relates to light-emitting polymers, and more particularly relates to silylated poly (phenylenevinylene) compounds and their use in the manufacture of polymer light-emitting diodes (PLED).

2. State of the Art

Electroluminescent devices which are manufactured from organic materials, such as polymers, are known in the art and have a number of advantages over traditional inorganic electroluminescent devices, which include low driving voltages, simple manufacture, broad ranges of emitted light, and the ability to create large area displays. In particular, the manufacture of electroluminescent devices using polymers is aided by their mechanical and thermal stability. However, although some known polymers and their precursors are soluble in certain solvents, storage of their solutions can lead to problems such as gel formation.

In particular, light-emitting devices based on poly(1,4-phenylenevinylene) compounds (PPV) have been described in the art, for example in *Nature*, 1990, 347, 539. However, light-emitting devices which are based on existing PPV materials may suffer from a number of problems, including complex multi-step manufacturing processes, such as the precursor route where polymerization occurs on the device itself, which may lead to defects in the final device. Such defects can lead to a short life-time of the device. Other disadvantages of such polymers include a lack of suitable materials having light-emitting ranges across the full width of the visible spectrum, which is necessary to create full-color displays. In particular, there is a need to provide polymers which emit green light. Also, in order to be commercially useful, the polymers should have a high quantum efficiency.

BRIEF SUMMARY OF THE INVENTION

The present invention seeks to provide an improved light-emitting polymer.

According to the present invention, there is provided a compound according to formula (I),

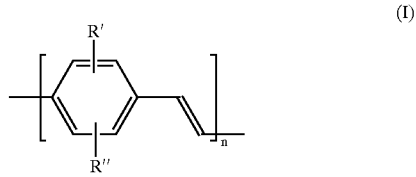

(I)

wherein:

R' and R" are selected from the group consisting of R'=$SiR_1R_2R_3$ and R"=H; R'=$SiR_1R_2R_3$ and R"=$SiR_4R_5R_6$; R'=$Ar_1SiR_1R_2R_3$ and R"=H; and R'=$Ar_1SiR_1R_2R_3$ and R"=$Ar_2SiR_4R_5R_6$;

$R_1$, $R_2$, $R_3$, $R_4$, $R_5$, and $R_6$ are independently selected from the group consisting of hydrogen, alkyl, alkenyl, alkynyl, aryl, cycloalkyl, cycloalkenyl, cycloalkynyl, arylalkyl, arylalkenyl, and arylalkynyl;

$Ar_1$ and $Ar_2$ are independently selected from the group consisting of arylene, arylenealkylene, arylenealkynylene, heteroarylene, heteroarylenealkylene, heteroarylenealkenylene and heteroarylenealkynylene; and n is at least 20.

Preferably, n is from about 50 up to about 10,000.

Advantageously, n is from about 100 up to about 2,000.

Conveniently, $R_1$, $R_2$, $R_3$, $R_4$, $R_5$, $R_6$ are independently selected from the group consisting of hydrogen, $C_1$–$C_{20}$ alkyl, $C_1$–$C_{20}$ alkenyl, $C_1$–$C_{20}$ alkynyl, $C_6$–$C_{30}$ aryl, $C_3$–$C_{30}$cycloalkyl, $C_4$–$C_{30}$ cycloalkenyl, $C_4$–$C_{30}$ cycloalkynyl, $C_7$–$C_{40}$ arylalkyl, $C_7$–$C_{40}$ arylalkenyl, and $C_7$–$C_{40}$ arylalkynyl; and $Ar_1$ and $Ar_2$ are independently selected and are selected from the group consisting of $C_6$–$C_{30}$ arylene, $C_6$–$C_{30}$ arylenealkylene, $C_6$–$C_{30}$ arylenealkynylene, $C_6$–$C_{30}$ heteroarylene, $C_6$–$C_{30}$ heteroarylenealkylene, $C_6$–$C_{30}$ heteroarylenealkenylene and $C_6$–$C_{30}$ heteroarylenealkylene.

Advantageously, R' and R" are attached at the $C_2$–$C_3$, $C_2$–$C_5$, or $C_2$–$C_6$ positions.

Preferably, R' and R" are attached at the $C_2$–$C_5$ positions.

Conveniently, R'=$SiR_1R_2R_3$ and R"=$SiR_4R_5R_6$.

Advantageously, R'=$Ar_1SiR_1R_2R_3$ and R"=$Ar_2SiR_4R_5R_6$.

Preferably, $Ar_1$ and $Ar_2$ are thiophenyl.

Conveniently, $R_1$, $R_2$, $R_3$, $R_4$, $R_5$, and $R_6$ are alkyl.

Advantageously, $R_1$, $R_2$, $R_4$, and $R_5$ are methyl.

Preferably, $R_3$ and $R_6$ are selected from the group consisting of methyl, butyl, decyl, octadecyl, and dodecyl.

According to a further aspect of the invention, there is provided a compound selected from the group consisting of:
poly(2,5-bistrimethylsilyl-1,4-phenylenevinylene),
poly(2,5-bisbutyldimethylsilyl-1,4-phenylenevinylene),
poly(2,5-bisdecyldimethylsilyl-1,4-phenylenevinylene),
poly(2,5-bisdimethyldodecysilyl-1,4-phenylenevinylene),
poly(2,5-bisdimethyloctadecylsilyl-1,4-phenylenevinylene),
poly(2-decyldimethylsillyl-1,4-phenylenevinylene),
poly(2,5-bis(5'dimethyldodecylsilylthienyl)-1,4-phenylenevinylene), and
poly(2-(5'-demethyldodeclylsilylthienyl)-1,4-phenylenevinylene).

According to another aspect of the invention there is provided a solution comprising a solvent and a compound of the invention.

Preferably, the solvent is selected from the group consisting of tetrahydrofuran, chloroform, 1,1,2,2-tetrachloroethylene, toluene and xylene.

According to a further aspect of the invention there is provided a method of making a compound of the invention, comprising the act of performing a Gilch dehalogenation polymerization reaction on the corresponding 1,4-bisbromomethyl benzene monomer.

According to yet another aspect of the invention there is provided a method of making a polymer light-emitting diode (PLED) comprising the acts of providing a first conductive layer, depositing an emissive layer comprising a compound of the invention onto the first conductive layer, and depositing a second conductive layer onto the emissive layer.

Preferably, the emissive layer is deposited by spin coating.

According to another aspect of the invention, there is provided a polymer light-emitting diode (PLED) comprising an emitter which comprises a compound of the invention.

Preferably, the emitter is an emissive layer interposed between a first conductive layer and a second conductive layer.

Preferably, the first conductive layer is on a substrate.

Conveniently, the substrate is glass or plastic.

Advantageously, the first conductive layer is an anode, and the second conductive layer is a cathode.

Preferably, the cathode comprises a reflective metal or a semitransparent conductor.

Conveniently, the cathode comprises calcium, magnesium, aluminum, silver or indium, or an alloy thereof.

Advantageously, the anode comprises indium tin oxide (ITO) or polyaniline (PANI).

Preferably, the PLED further comprises a hole injection/transporting layer interposed between the anode and the emissive layer.

Conveniently, the hole injection/transporting layer comprises copper phthalocyanine (CuPC), polyaniline (PANI), or poly(3,4-ethylenedioxy-thiophene) (PEDOT).

Advantageously, the PLED further comprises an electron injection/transporting layer interposed between the cathode and the emissive layer.

Preferably, the electron injection/transporting layer comprises 8-hydroxyquinoline aluminum (Alq3), a 1,3,4-oxadiazole, a 1,3,4-oxadiazole-containing polymer, a 1,3,4-triazole, a 1,3,4-triazoles-containing polymer, a quinoxaline-containing polymer, copper phthalocyanine, or a cyano-poly(phenylenevinylene) (CN-PPV).

BRIEF DESCRIPTION OF THE DRAWINGS

In order that the invention may be more readily understood, and so that further features thereof may be appreciated, the invention will now be described, by way of example, with reference to the accompanying drawings in which.

DETAILED DESCRIPTION OF THE INVENTION

Figure 1:
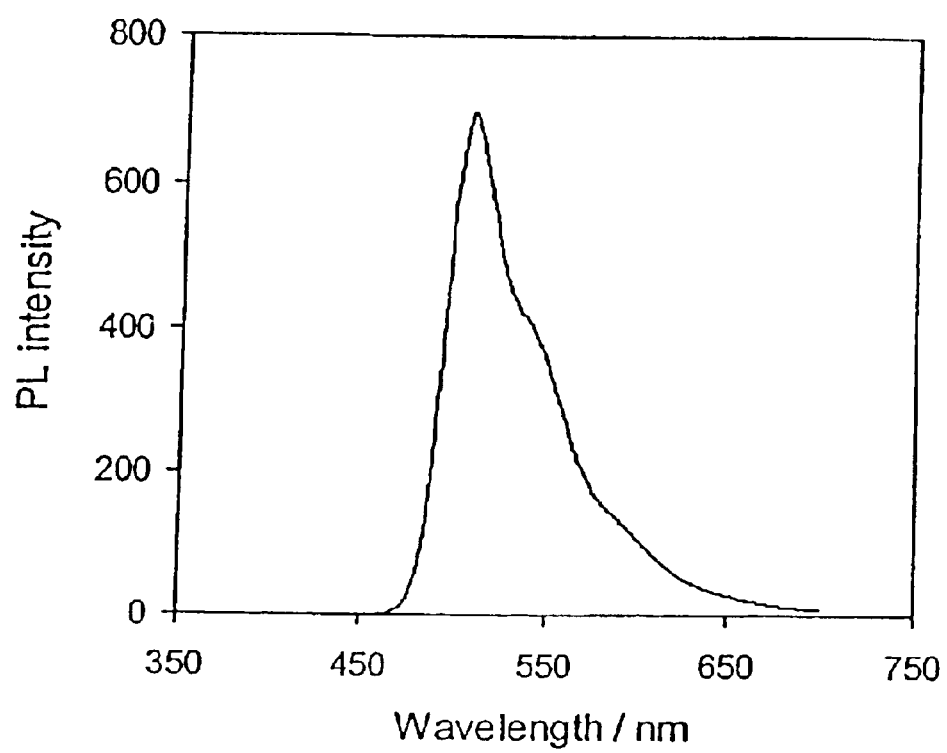
FIG. 1 is a graph showing the photoluminescence (PL) spectrum of a compound of the invention.

The compounds of the present invention are light-emitting polymers, which may be used in the manufacture of polymer light-emitting diodes (PLEDs), which may themselves be used in electroluminescent devices such as display units or lasering devices.

As used herein, the term "alkyl", means a straight or branch chain alkyl group, for example methyl, n-butyl, t-butyl, decyl, octadecyl and dodecyl.

The term "aryl" means phenyl, or a polycyclic fused ring structure such as naphthyl.

The term "heteroaryl" means a mono- or polycyclic aromatic ring structure containing one or more heteroatoms selected from oxygen, nitrogen, silicon and sulphur, for example indolyl, pyridinyl, thienyl or furyl.

The compounds of the invention are silylated poly (phenylenevinylene) compounds according to formula (I),

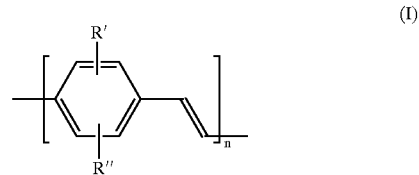

(I)

wherein:

$R'=SiR_1R_2R_3$ and $R''=H$; $R'=SiR_1R_2R_3$ and $R''=SiR_4R_5R_6$; $R'=Ar_1SiR_1R_2R_3$ and $R''=H$; or $R'=Ar_1SiR_1R_2R_3$ and $R''=Ar_2SiR_4R_5R_6$;

$R_1$, $R_2$, $R_3$, $R_4$, $R_5$, and $R_6$ are the same or different and are selected from the group consisting of hydrogen, alkyl, alkenyl, alkynyl, aryl, cycloalkyl, cycloalkenyl, cycloalkynyl, arylalkyl, arylalkenyl, and arylalkynyl;

$Ar_1$ and $Ar_2$ are the same or different and are selected from the group consisting of arylene, arylenealkylene, arylenealkynylene, heteroarylene, heteroarylenealkylene, heteroarylenealkenylene and heteroarylenealkynylene; and n is at least 20, more preferably from about 50 to about 10,000, and even more preferably from about 100 to about 2,000.

The compounds of the present invention may be synthesized as illustrated in the following schemes.

Scheme 1 below illustrates the synthesis of two embodiments of the compounds of the invention, a poly(2,5-bis silylated phenylenevinylene) (F), and a poly(2-silylated phenylenevinylene) (G).

Scheme 1

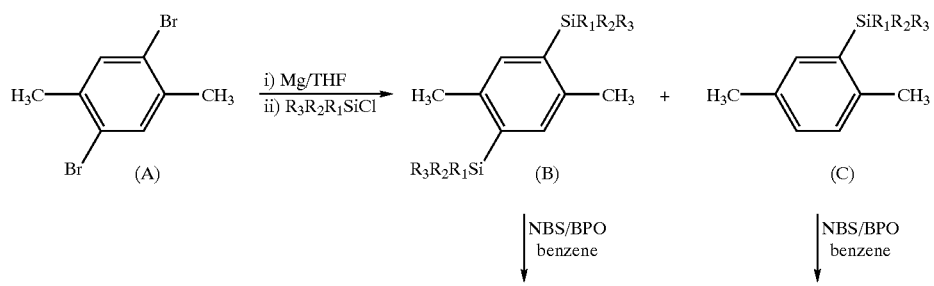

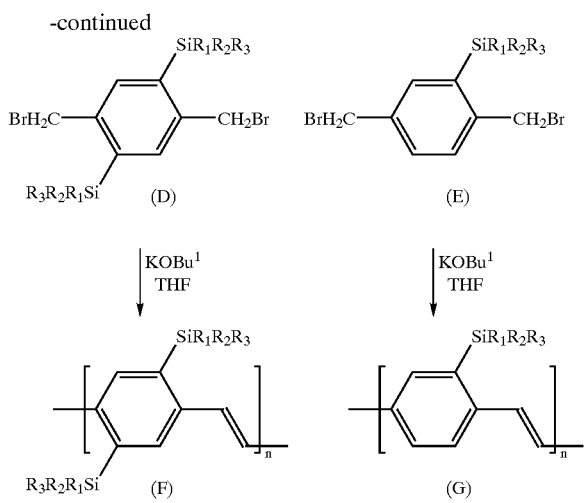

2,5-bis silyl-p-xylene (B) and 2-silyl-p-xylene (C) may be synthesized simultaneously from the coupling of one equivalent of the Grignard reagent of the starting material, 2,5-dibromo-p-xylene (A), with 2.2 equivalents of a silyl chloride in tetrahydrofuran (THF). The Grignard reagent 2,5-bisbromomagnesium-p-xylene may be prepared by refluxing (A) with 2.2 equivalents of magnesium turnings in anhydrous THF, initiated by iodine, for 3 to 6 hours. After purification by silica gel chromatography eluted by hexane, the 2,5-bis silyl-p-xylene (B) and 2-silyl-p-xylene, (due to partial conversion of the Grignard reagent to the silylated product), may be obtained.

Alternatively, 2-silyl-p-xylene may also be obtained starting from 2-bromo-p-xylene. 2-Bromo-p-xylene may be reacted with 1.2 equivalents of magnesium turnings in THF with refluxing for 3 to 5 hours. The resulting Grignard reagent may be coupled with 2.2 equivalents of a silyl chloride in THF with refluxing for 12 to 24 hours. After purification by silica gel chromatography eluted with hexane, 2-silyl-p-xylene (C) may be obtained.

2,5-Bis silyl-p-xylene (B) and 2-silyl-p-xylene (C) may be bromination by 2.2 equivalents of N-bromosuccinimide (NBS) in benzene catalyzed by benzoyl peroxide (BPO). The reaction mixture may be stirred at room temperature under the irradiation of tungsten light for 2 to 3 hours. The corresponding products, 2,5-bis silyl-1,4-bisbromomethylbenzene (D) and 2-silyl-1,4-bisbromomethyl-benzene (E) may be obtained after purification by silica-gel chromatography, eluted by hexane.

Polymerization of each of the monomers (F) and (G) may be performed under Gilch dehalogenation polymerization conditions. In this reaction, the monomers (D) and (E) may be treated with potassium t-butoxide in anhydrous THF at room temperature for 24 hours. The concentration of monomer may be in the range of about 0.02 to about 0.20 M, preferably in the range of about 0.02 to about 0.10 M, and about 5 to 6 equivalents of the base may be used, with respect to the monomer. To work up the reaction, the reaction mixture may be added slowly to stirred methanol to precipitate the polymer, which may then be collected by filtration and then washed successively with methanol, deionized water, and methanol. To purify the polymer, the precipitated product may be subjected to Soxhlet extraction with methanol, then acetone for at least 12 hours successively to remove low molecular components. Finally, the polymer may dried under vacuum at room temperature for at least 12 hours. The polymers of the invention are generally yellow-green to yellow-orange solids, and are stable in air below about 300° C.

Compounds of the invention containing arylsilyl side chains can be similarly synthesized, as depicted below in Scheme 2 and Scheme 3.

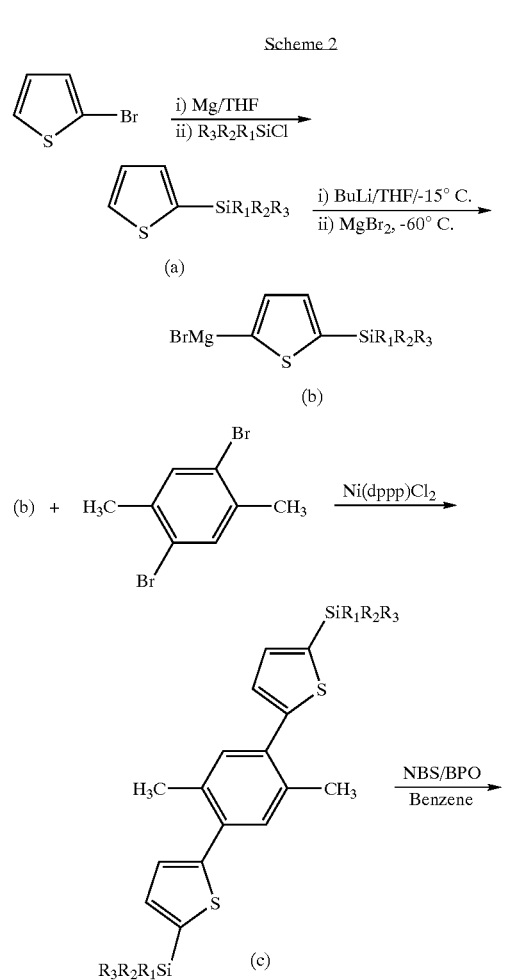

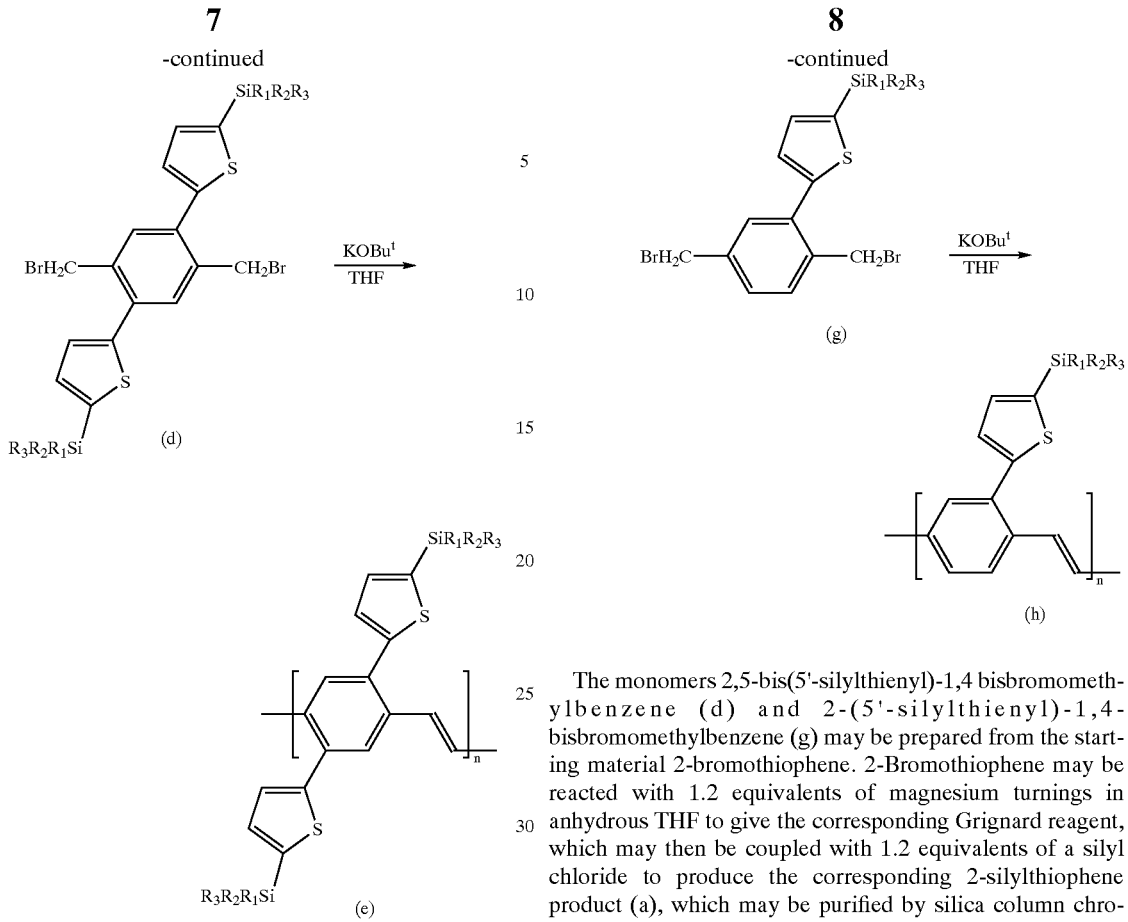

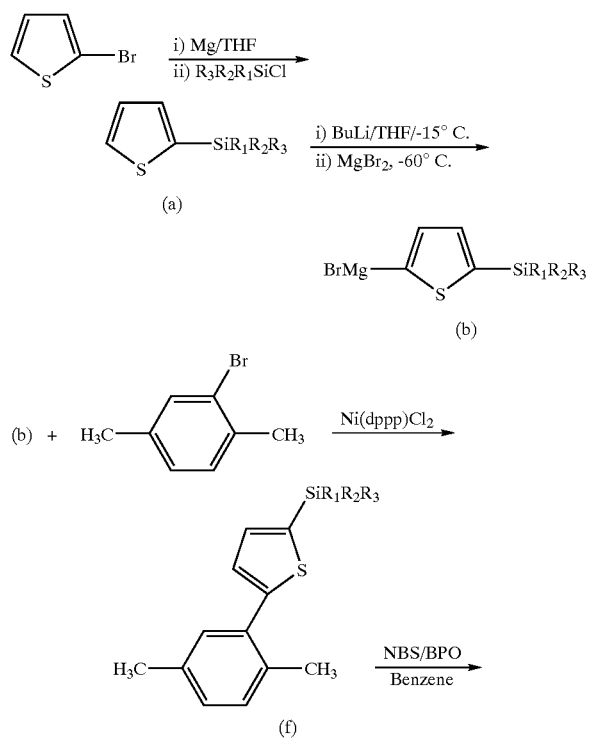

The monomers 2,5-bis(5'-silylthienyl)-1,4 bisbromomethylbenzene (d) and 2-(5'-silylthienyl)-1,4-bisbromomethylbenzene (g) may be prepared from the starting material 2-bromothiophene. 2-Bromothiophene may be reacted with 1.2 equivalents of magnesium turnings in anhydrous THF to give the corresponding Grignard reagent, which may then be coupled with 1.2 equivalents of a silyl chloride to produce the corresponding 2-silylthiophene product (a), which may be purified by silica column chromatography. 2-silythiophene (a) may be converted into the corresponding Grignard reagent by reaction with 1 equivalent of n-butyl-lithium (n-BuLi) under nitrogen. After stirring at about −25 to about −15° C. for 1 to 2 hours, the reaction mixture may be added to a THF solution containing 1 equivalent of freshly prepared magnesium bromide at −60° C. After stirring for 0.5 to 1 hour, the reaction mixture may be warmed to room temperature. The resulting 2-bromomagnesium-5-silylthiophene (b) may be used to prepare 2,5-bis(5'-silylthienyl)-p-xylene (c), and 2-(5'-silylthienyl)-p-xylene (f) by reaction with either 2,5-dibromo-p-xylene or 2-bromo-p-xylene, respectively, using 1 mol % of (1,3-bis(diphenylphosphino)propane)nickel chloride (Ni(dppp)Cl$_2$) catalyst. The purified products (c) or (f) can be brominated by NBS using the aforementioned procedure as for preparing (D) and (E), to afford the corresponding monomer products (d) and (g) respectively.

The monomers (d) and (g) may be polymerized using the aforementioned Gilch dehalogenation polymerization reaction to afford the corresponding products, (e) and (h) respectively.

Compounds of the present invention, particularly those bearing silyl groups on the $C_2$ and $C_3$, $C_2$ and $C_5$, or $C_2$ and $C_6$ positions on the phenylene ring are soluble in a range of solvents, such as tetrahydrofuran, chloroform, 1,1,2,2-tetrachloroethylene, toluene and xylene. The formation of solutions of the compounds of the invention enables them to be made, stored and then used in the manufacture of light-emitting devices.

Figure 2:
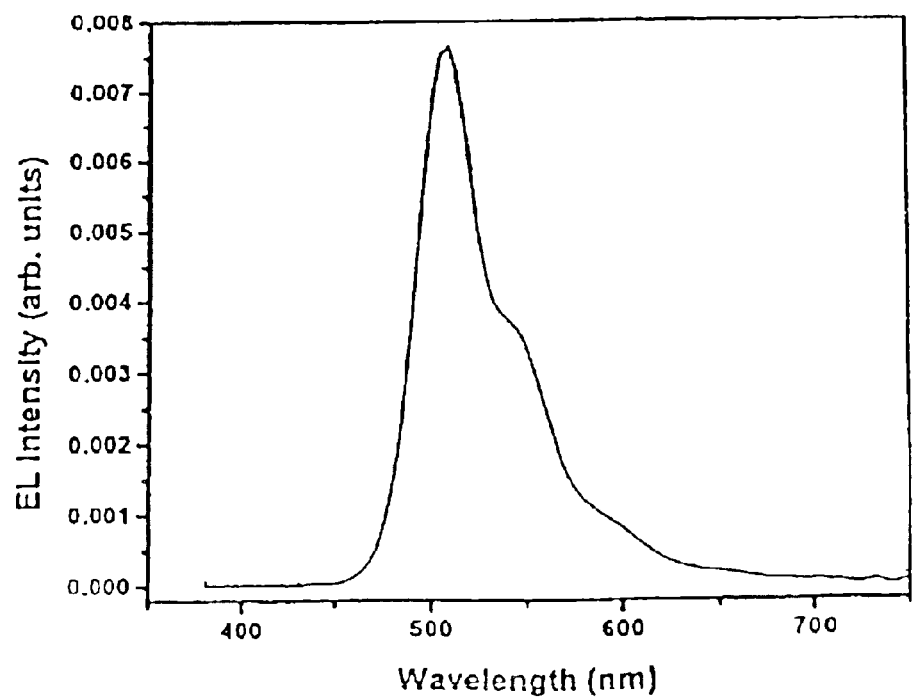
FIG. 2 is a graph showing the electroluminescence (EL) spectrum of a polymer light-emitting diode (PLED) of the invention.

Compounds of the present invention, particularly those bearing substituents at the $C_2$ and $C_5$ positions, display useful light-emitting properties, including the emission of green light with sharp emission spectra. Such compounds may demonstrate a full width at the half maximum (FWHM) of about 59 nm in solution, and about 50 to 64 nm in films. A representative photoluminescence spectrum of one of the compounds of the invention in a film state is shown in FIG. 2.

Optical quality films of the compounds of the invention may be prepared on different substrates, such as quartz plates, micro slides, indium tin oxide (ITO) coated glass, and polymer coated glass, using conventional spin-coating technology from their solutions, for example, in toluene or xylene.

Figure 4:
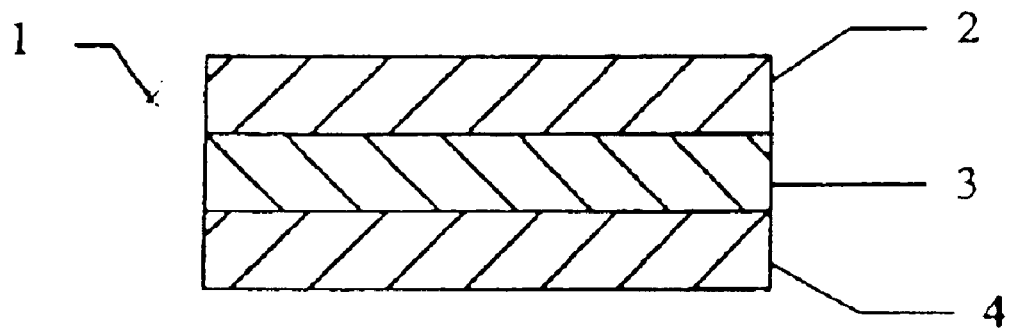
FIG. 4 is a cross-sectional view of a PLED according to the invention.

Another aspect of the invention relates to polymer light-emitting diodes (PLEDs) comprising an emitter which comprises a compound of the invention. As shown in FIG. 4, a preferred embodiment of a PLED 1 of the invention comprises an emitter in the form of an emissive layer 3, which is interposed between two conductive layers 2 and 4 (an anode and a cathode).

A PLED of the invention may, for example, be manufactured where the anode (or hole-injecting electrode) consists of ITO or polyaniline (PANI) in the conductive emeraldine salt form, deposited or spin coated onto a transparent substrate such as glass or plastic, giving a film having a thickness of from about 50 to about 200 nm. The film thickness of the emissive layer may range from about 50 to about 200 nm. The cathode may comprise a layer of calcium, magnesium, aluminum, silver, or indium, or an alloy thereof, having a thickness in the range of about 50 nm to about 300 nm, and may be formed by thermal evaporation onto the surface of the emissive layer. Preferably, the cathode comprises calcium or magnesium.

Figure 5:
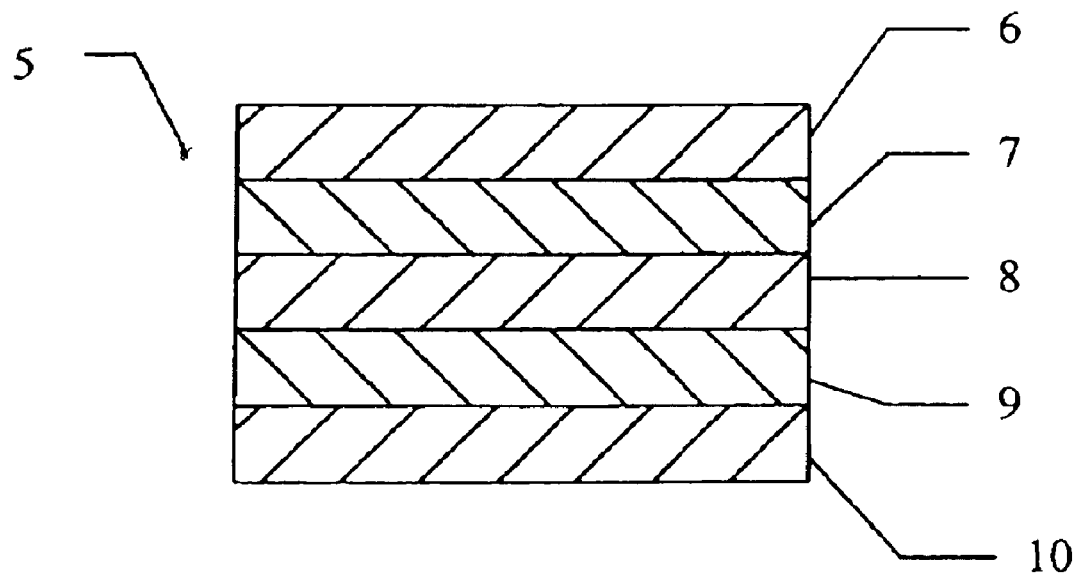
FIG. 5 is a cross-sectional view of a further embodiment of a PLED according to the invention.

In order to improve the hole injection from the anode, or the electron injection from the cathode, into the emissive layer, a hole injection/transporting layer or an electron/transporting layer may be used. FIG. 5 illustrates a PLED 5 according to this aspect of the invention, comprising an anode 10, adjacent a hole injection/transporting layer 9, adjacent an emissive layer 8, adjacent an electron/transporting layer 7, adjacent a cathode 6.

Copper phthalocyanine (CuPc), polyaniline doped with a strong organic acid e.g. poly(styrenesulfonic acid) (PSS), or a poly(3,4-ethylenedioxy-thiophene) (PEDOT) doped with poly(styrenesulfonic acid (PSS), may be used as a hole injection material.

The hole injection/transporting layer 9 may have a thickness ranging from about 20 nm to about 300 nm, and may be formed on the anode surface by thermal evaporation or by spin coating. The emissive layer 8 may then be deposited onto the hole injection/transporting layer 9 by spin coating.

Before the cathode layer 6 is deposited onto the emissive layer 8, an electron injection/transporting layer 7 may be deposited by thermal evaporation or by solution coating according to the material used. Examples of electron injection/transporting layer materials include 8-hydroxyquinoline aluminum (Alq3), a 1,3,4-oxadiazole, a 1,3,4-oxadiazole-containing polymer, a 1,3,4-triazole, a 1,3,4-triazoles-containing polymer, a quinoxaline-containing polymer, copper phthalocyanine, and a cyano-poly(phenylenevinylene) (CN-PPV). The thickness of the electron injection/transporting layer may be from about 20 nm to about 300 nm, and preferably is in the range of about 30 to about 150 nm.

FIG. 1 shows the photoluminescence spectrum recorded for a sample of a compound of the invention (poly(2,5-bis(decyldimethylsilyl-1,4-phenylenevinylene)) (DS-PPV).

A PLED device comprising a compound of the invention may emit green light under an applied voltage. FIG. 2 shows an electroluminescence (EL) spectrum for a PLED of the invention, the emissive layer of which comprises poly(2,5-bis(decyldimethylsilyl-1,4-phenylenevenylene)) (DS-PPV). Details of the preparation of the PLED, and the conditions used to record this EL spectrum are given in Example 10 below.

Figure 3:
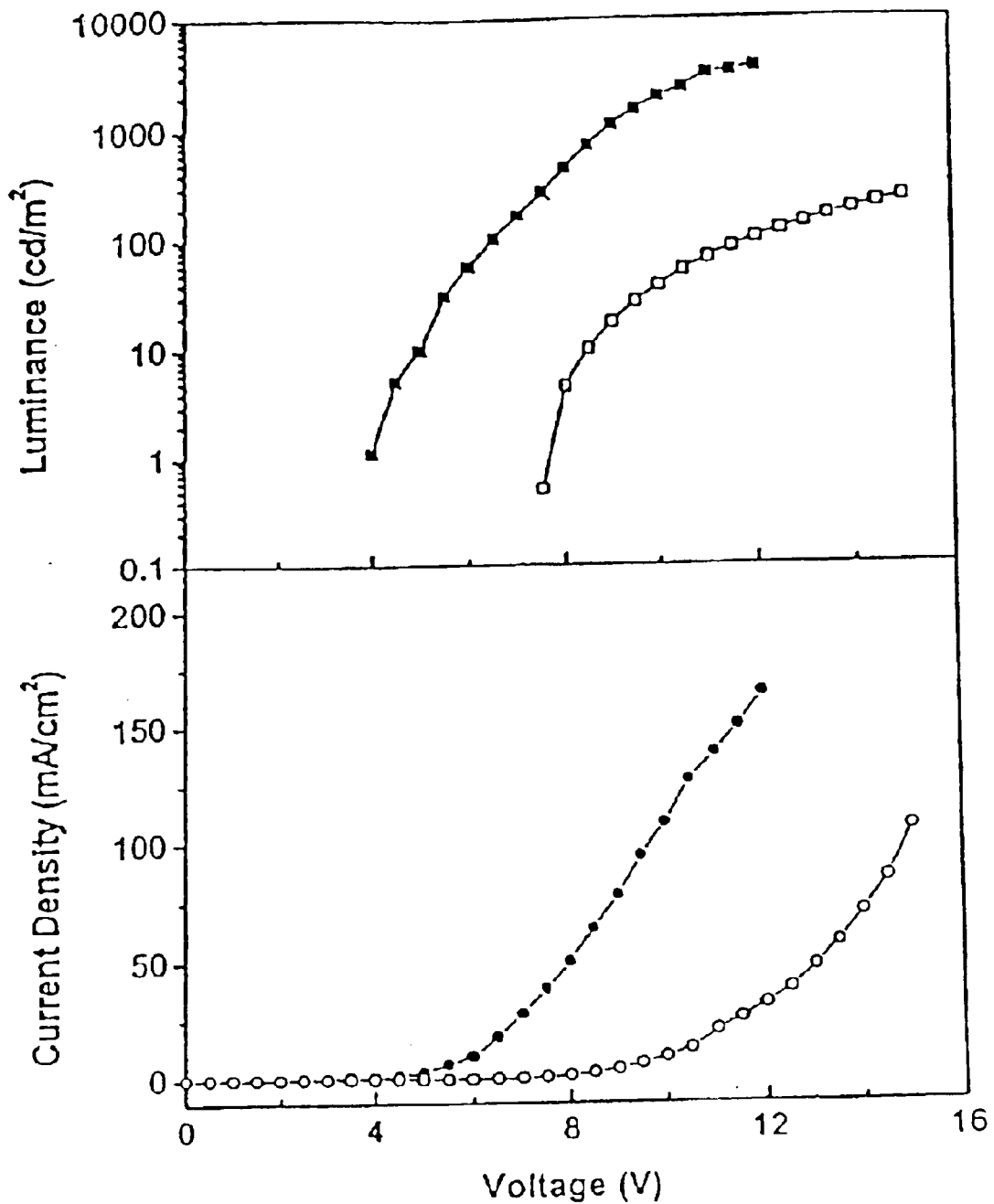
FIG. 3 is a graph showing the current density and luminance versus voltage (I-V-L) spectra of two polymer light-emitting diodes (PLEDs) of the invention.

FIG. 3 shows the current density and luminance versus voltage (I-V-L) spectra of two PLEDs of the invention, which are described in Examples 9 and 10 below. The lines denoted by open circles and squares relate to the PLED described in Example 9 (ITO/polymer/Mg:Ag), and the lines denoted by the filled circles and squares relate to the PLED described in Example 10 (ITO/PEDOT-PSS/polymer Mg:Ag).

This invention will be further described by the following examples. With regard to the starting materials and the agents that are known compounds, some of these may be purchased from commercial suppliers. Other starting materials that are known and their analogues maybe prepared by methods well known in the art. Examples of compounds available from commercial suppliers, and citations to the synthesis of other compounds and their analogues are provided in the following sections.

2,5-Dibromo-p-xylene, potassium tert-butoxide (1.0 M solution in THF), N-bromosuccinimide (NBS), magnesium turnings, 2-bromothiophene, n-butyllithium (1.6 M in hexane), benzoyl peroxide, (1,3-bis(diphenylphosphino) propane)nickel(II) chloride (Ni(dppp)Cl$_2$), were purchased from Aldrich. Trimethylsilyl chloride, butyldimethylsilyl chloride, decyldimethylsilyl chloride, dimethyldodecylsilyl chloride, dimethyloctadecylsilyl chloride were obtained from Fluka. All of the chemicals were used without further purification.

NMR spectra were collected on a Bruker ACF-300 or a Bruker AMX-500 spectrometer with chloroform-d as solvent and tetramethylsilane as internal standard. FT-IR spectra were recorded on a Bio-Rad FTS 165 spectrometer by dispersing samples in KBr disks. UV-Vis and fluorescence spectra were obtained on a Shimadzu UV-NIR 3100 spectrophotometer and on a Perkin Elmer LS 50B luminescence spectrometer, respectively. Thermogravimetric analysis (TGA) was conducted on a DuPont Thermal Analyst 2100 system with a TGA 2950 thermogravimetric analyzer under a heating rate of 20° C./min and an air flow rate of 75 ml/min. Differential scanning calorimetry (DSC) was run on a DuPont DSC 2910 module in conjunction with the DuPont Thermal Analyst system. Elemental microanalyses were performed on a Perkin-Elmer 2400 elemental analyzer for C, H, N, and Br determination. Gel permeation chromatography (GPC) analysis was conducted on a Perkin Elmer Model 200 HPLC system equipped with Phenogel™ MXL and MXM columns using polystyrene as standard and tetrahydrofuran (THF) as eluent. EL spectra of the devices were measured with a PR650 SpectraScan photo-spectrometer. Luminance-current density-voltage (L-I-V) characteristics were recorded simultaneously with the measurement of the EL spectra by attaching the photo-spectrometer to a Keithley 236 programmable voltage-current source.

EXAMPLE 1

Preparation of 2,5-bistrimethylsilyl-p-xylene 10.52 g of 2,5-dibromo-p-xylene (40 mmol) was reacted with 2.08 of magnesium turnings (88 mmol) in 40 ml of anhydrous THF for 4 hours with refluxing (initiated by iodine) to give the 2,5-bisbromomagnesium-p-xylene Grignard reagent. To this solution, cooled in an ice bath, was added a solution of 11.2 ml trimethylsilyl chloride (88 mmol) in 40 ml of anhydrous THF. The mixture was refluxed for 24 hours and then cooled in an ice bath. After it was quenched with saturated ammonium chloride aqueous solution, THF was evaporated and the residue was extracted with hexane (30 ml×2). The combined organic layers were washed with water, brine and then dried over anhydrous magnesium sulfate. After the solution was evaporated under a reduced pressure, the residue was recrystallized in ethanol to afford white plate crystals 6.1 g, (yield 61%). M.p. 56.0–57.5° C. MS: 250. $^1$H NMR (300 MHz, CDCl$_3$, ppm) δ 0.31 (18H, s, —Si(CH$_3$)$_3$), 2.42 (6H, s), 7.24 (2H, s). Anal. Calcd for C$_{14}$H$_{26}$Si$_2$: C, 67.12; H, 10.46. Found: C, 66.94; H, 10.23.

Preparation of 2,5-bis(trimethylsilyl)-1,4-bisbromomethylbenzene g of 2,5-bistrimethysilyl-p-xylene (4.0 mmol), 1.57 g of N-bromosuccimide (8.8 mmol), a catalytic amount of benzoyl peroxide (BPO) and 120 ml of benzene were charged in a 250 ml flask. The mixture was stirred at ambient temperature under tungsten light for 2 hours. The solution was then washed three times with water then with brine and the organic phase was dried over anhydrous magnesium sulfate. After filtration and solvent evaporation, the crude product was recrystallized in ethanol/ethyl acetate to give 0.70 g of a white crystal product, and the filtrate purified by silica-gel chromatography and then recrystallized in ethanol/ethyl acetate to give another 0.15 g of product (52% yield). M.p.: 96.0–97.0° C. MS: 408. FT-IR (KBr) $v_{max}$/cm$^{-1}$: 3077, 3004, 2958, 2898, 1445, 1406, 1248, 1212, 1192, 1127, 868, 839, 787, 760, 693, 663, 637, 532, 451. $^1$H NMR (300 MHz, CDCl$_3$, ppm) δ 0.40 (18H, s, —Si(CH$_3$)$_3$) 4.60 (4H, s, —CH$_2$Br), 7.52 (2H, s). $^{13}$C NMR (300 MHz CDCl$_3$, ppm) δ 142.0, 140.8, 137.3, 34.0, 0.2. Anal. Calcd for C$_{14}$H$_{24}$Br$_2$Si$_2$: C, 41.18; H, 5.92; Br, 39.14. Found: C, 40.80; H, 5.66; Br, 39.16.

Preparation of poly(2,5-bistrimethylsilyl-1,4-phenylenevinylene) (MS-PPV)

A solution of 0.500 g (1.23 mmol) 2,5-bistrimethylsilyl-1,4bisbromomethylbenzene in 50 ml of anhydrous THF was charged in a 100 ml flask. To this stirred solution was added dropwise 7.5 ml of a 1.0 M solution of potassium tert-butoxide (7.5 mmol) in anhydrous THF at room temperature. The mixture was continuously stirred for 24 hours, then poured into 400 ml of methanol with stirring. The resulting precipitate was collected then extracted through a Soxhlet extractor with methanol and acetone for 12 hours then dried under vacuum to afford 0.263 g (yield 87%) of orange-yellow powder. The further purification of MS-PPV was performed by Soxhlet extraction with methanol and acetone successively. FT-IR $v_{max}$/cm$^{-1}$: 3054, 2954, 2896, 1474, 1250, 1163, 1107, 961, 835, 700, 689, 635, 519, 463. Anal. Calcd for (C$_{14}$H$_{22}$Si$_2$)$_n$: C, 68.22; H, 9.00. Found C, 67.65; H, 8.56.

EXAMPLE 2

Preparation of 2,5-bisbutyldimethylsilyl-p-xylene

The Grignard reagent of 2,5-bisbromomagnesium-p-xylene was prepared by refluxing the mixture of 5.28 g of 2,5-dibromo-p-xylene (20 mmol) and 1.06 g of magnesium turnings (44 mmol) in 20 ml of anhydrous THF for 4 hours (initiated by iodine). To this solution, cooled in an ice bath, was added a solution of 6.63 g of butyldimethylsilyl chloride (44 mmol) in 20 ml of anhydrous THF. The mixture was refluxed for 24 hours and then cooled in an ice bath. After it was quenched with saturated ammonium chloride aqueous solution, the THF was removed by evaporation and the residue was extracted twice with 30 ml of hexane. The combined organic layers were washed with water, brine and then dried over anhydrous magnesium sulfate. After the solvent was evaporated under reduced pressure, the residue was purified by silica-gel chromatography, eluted with hexane, to give 3.54 g of a colorless liquid (yield 53%). MS: 334. $^1$H NMR (300 MHz, CDCl$_3$ ppm) δ 0.30 (12H, s, —Si(CH$_3$)$_2$), 0.79–0.93 (10H, m, —SiCH$_2$— and —CH$_3$), 1.27–1.42 (8H, m, —(CH$_2$)$_2$—), 2.42 (6H, s,) 7.19 (2H, s). Anal. Calcd for C$_{20}$H$_{38}$Si$_2$: C, 71.77; H, 11.44. Found: C, 71.93; H, 11.50.

Preparation of 2,5-bis(butyldimethylsilyl)-1,4-bisbromomethylbenzene 5.01 g (15.0 mmol) of 2,5-bisbutyldimethylsilyl-p-xylene, 5.87 g (33.0 mmol) of NBS, a catalytic amount of benzoyl peroxide (BPO) and 150 ml of benzene were charged into a flask. The reaction mixture was stirred at ambient temperature and irradiated by a tungsten lamp for 2 hours. The solution was then washed three times with water followed by brine. The organic phase was dried over anhydrous magnesium sulfate. After filtration and evaporation of solvent, the crude product was purified by silica-gel chromatography to give 3.01 of a colorless liquid product (41% yield). MS: 492. FT-IR (KBr) $v_{max}$/cm$^{-1}$3075, 2949, 2929, 2848, 1469, 1413, 1376, 1343, 1249, 1208, 1191, 1168, 1126, 910, 877, 865, 842, 826, 810, 789, 753, 719, 701, 681, 659, 538, 482, 458, 439. $^1$H NMR (300 MHz, CDCl$_3$ ppm) δ 0.39 (12H, s, —Si(CH$_3$)—$_2$), 0.85–0.92 (10H, m, —SiCH$_2$— and —CH$_3$), 1.27–1.44 (8H, m, —(CH$_2$)$_2$—), 4.58 (4H, s, CH$_2$Br), 7.49 (2H, s). $^{13}$C NMR (300 MHz, CDCl$_3$, ppm) δ 142.0, 140.0, 137.6, 34.1, 26.4, 26.0, 16.0, 13.7, -1.6. Anal. Calcd for C$_{20}$H$_{36}$Br$_2$Si$_2$: C, 48.77; H, 7.37; Br, 32.45; Found: C, 48.53; H, 7.42; Br, 32.29.

Preparation of poly(2,5-bisbutyldimethylsilyl-1,4-phenylenevinylene) (BS-PPV)

A solution of 0.984 g (2.0 mmol) 2,5-bis(butyldimethylsilyl)-1,4-bisbromomethylbenzene in 30 ml of anhydrous THF was charged into a 100 ml flask. To this solution was added dropwise 12 ml of a 1.0 M solution of potassium tert-butoxide (12.0 mmol) in anhydrous THF at room temperature with stirring. The mixture was continuously stirred for 24 hours and then poured into 300 ml of methanol. The resulting yellow precipitate was washed with deionized water and dried under vacuum. The crude polymer was redissolved in chloroform and reprecipitated in methanol twice. After being extracted through Soxhlet with methanol and acetone for 12 hours successively, the polymer was finally dried under vacuum to give 0.290 g (44% yield) of a yellow solid. The molecular weight was measured by means of gel permeation chromatography (GPC) using THF as eluent and polystyrene as standard to be M$_n$=73,400 and M$_w$=187,400 with a polydispersity index of 2.55. Using quinine sulfate (ca 1×10$^{-5}$M) in 0.1 M H$_2$SO$_4$ as the standard, the quantum yield of the polymer in chloroform (ca 1×10$^{-6}$ M) was measured as high as 87%. FT-IR (KBr) $v_{max}$/cm$^{-1}$: 3044, 2961, 2923, 2855, 1467, 1250, 1194, 1164, 1108, 1078, 1064, 959, 836, 810, 760, 720, 641, 464. $^1$H NMR (300 MHz, CDCl$_3$ ppm) δ 0.24–0.56 (12H, s, —Si (CH$_3$)$_2$), 0.72–1.04 (10H, br, —SiCH$_2$—, —CH$_3$), 1.20–1.47 (8H, br), 7.36–7.58 (2H, br), 7.62–7.96 (2H, br, —CH=CH). $^{13}$C NMR (300 MHz, CDCl$_3$, ppm) δ 151.2, 135.6, 128.2, 125.3, 26.5, 26.2, 16.4, 13.7, −1.4. Anal. Calcd for (C$_{20}$H$_{34}$Si$_2$)$_n$: C, 72.65; H 10.36. Found: C, 72.59; H, 10.24.

EXAMPLE 3

Preparation of 2,5-bisdecyldimethylsilyl-p-xylene and 2-decyldimethylsilyl-p-xylene The Grignard reagent of 2,5-bisdecyldimethylsilyl was prepared by refluxing a mixture of 5.28 g 2,5-dibromo-p-xylene (20.0 mmol) and 1.06 g magnesium turnings (44.0 mmol) in 40 ml of anhydrous THF for 4 hours (initiated by iodine). To this solution, cooled in an ice bath, was added a solution of 12.2 ml decyldimethylsilyl chloride (45.0 mmol) in 40 ml of THF. The mixture was refluxed for 24 hours and then cooled in an ice bath. After being quenched with saturated ammonium chloride aqueous solution, the THF was evaporated and the residue was extracted three times with 30 ml of hexane. The combined organic layers were washed with water, brine and then dried over anhydrous magnesium sulfate. After the solvent was evaporated under reduced pressure, the residue was purified through silica-gelchromatorgraphy, and eluted with hexane to afford 5.69 g of a colorless liquid (yield 57%). 1.65 g of 2-decyldimethylsilyl-p-xylene was also obtained. MS: 502. $^1$H NMR (300 MHz, CDCl$_3$, ppm) δ 0.29 (12H, s, —Si (CH$_3$)$_2$), 0.79 (4H, t, —SiCH$_2$—), 0.88 (6H, t, —CH$_3$), 1.25–1.32 (32H, m, —(CH$_2$)$_8$—), 2.39 (6H, s), 7.19 (2H, s). Anal Calcd for C$_{32}$H$_{62}$Si$_2$: C, 76.41; H, 12.42. Found: C, 76.56; H, 12.23.

Preparation of 2,5-bis(decyldimethylsilyl)-1,4-bisbromomethylbenzene 1.00 g (2.0 mmol) 2,5-bis(decyldimethylsilyl)-p-xylene, 0.78 g (4.4 mmol) N-bromosuccinimide (NBS), a catalytic amount of benzoyl peroxide (BPO) and 60 ml of benzene were charged in a 100 ml flask. The mixture was stirred at ambient temperature under tungsten light for 2 hours, washed with water three times, and then washed with brine. The organic phase was dried over anhydrous magnesium sulfate. After filtration, the solvent was evaporated, and the residue purified by silica-gel chromatography eluted by hexane to afford 0.61 g of a colorless liquid (yield 46%), which solidified as a wax on standing. M.p.: 35.0–36.0° C. MS: 660. FT-IR (KBr) ν$_{max}$/cm$^{-1}$: 3077, 3004, 2956, 2917, 2855, 1468, 1411, 1344, 1251, 1207, 1190, 1170, 1125, 1004, 883, 864, 836, 819, 790, 759, 720, 702, 681, 660, 650, 538, 477, 457, 438. $^1$H NMR (300 MHz, CDCl$_3$, ppm) δ 0.38 (12H, s, —Si(CH$_3$)$_2$), 0.85–0.87 (10H, m, —SiCH$_2$—, CH$_3$), 1.24–1.31 (32H, m, —(CH$_2$)$_8$—), 4.58 (4H, s, —CH$_2$Br), 7.49 (2H, s). $^{13}$C NMR (300 MHz, CDCl$_3$, ppm) δ 142.0, 140.0, 137.5, 34.1, 33.4, 31.8, 29.6, 29.5, 29.3, 29.2, 23.8, 22.6, 16.3, 14.0, −1.6. Anal. Calcd for C$_{32}$H$_{60}$Br$_2$Si$_2$: C, 58.16; H, 9.15; Br, 24.18. Found: C, 57.98; H, 9.01; Br, 23.86.

Preparation of poly(2,5-bis(decyldimethylsilyl-1,4-phenylenevinylene)) (DS-PPV)

A solution of 0.500 g (0.76 mmol) of 2,5-bis(decyldimethylsilyl)-1,4bisbromomethylbenzene in 25 ml of anhydrous THF was charged in a 50 ml flask. To this stirred solution was added dropwise 5 ml of a 1.0 M solution of potassium tert-butoxide (5.0 mmol) in anhydrous THF at room temperature. The mixture was continuously stirred for 24 hours. The reaction mixture was then poured into 200 ml of methanol with stirring. The resulting yellow precipitate was collected and dissolved in chloroform and reprecipitated in methanol twice more. The polymer was by extracted through a Soxhlet extractor with methanol and acetone for 12 hours successively and dried under vacuum to afford 0.239 g of a yellow solid (63% yield). The molecular weight was measured by GPC to be M$_n$=117,700 and M$_w$=239,100 with a polydispersity index of 2.03. The quantum yield of the polymer in chloroform (ca 1×10$^{-6}$M) was measured as high as 86%. FT-IR (KBr) ν$_{max}$/cm$^{-1}$: 3057, 2956, 2923, 2852, 1465, 1249, 1162, 1108, 960, 835, 768, 721, 641, 526, 464. $^1$H NMR (500 MHz, CDCl$_3$, ppm) δ 0.20–0.55 (12H, s, —Si(CH$_3$)$_2$), 0.74–0.88 (6H, t, —CH$_3$), 0.88–1.02 (4H, br, —SiCH$_2$—), 1.02–1.46 (32H, m, —(CH$_2$)$_8$—), 7.32–7.68 (2H, br), 7.68–8.08 (2H, br, —CH=CH—). $^{13}$C NMR (500 MHz, CDCl$_3$, ppm) δ 151.4, 135.7, 128.2, 125.4, 33.6, 31.8, 30.2, 29.6, 29.3, 24.1, 22.6, 21.1, 16.7, 14.0, −1.4. Anal. Calcd for (C$_{32}$H$_{58}$Si$_2$)$_n$: C, 77.03; H, 11.72. Found: C, 76.82; H, 11.39.

EXAMPLE 4

Preparation of 2,5-bisdimethyldodecylsilyl-p-xylene

The Grignard reagent of 2,5-bisbromomagnesium-p-xylene was prepared by refluxing the mixture of 3.96 g 2,5-dibromo-p-xylene (15 mmol) and 0.79 g magnesium turnings (33 mmol) in 15 ml of anhydrous THF for 4 hours (initiated by iodine). To this solution, cooled in an ice bath, was added a solution of 8.66 g dimethyldodecysilyl chloride (33 mmol) in 15 ml of THF. The mixture was refluxed for 24 hours and then cooled in an ice bath. After quenching with saturated ammonium chloride solution, the THF was evaporated and the residue was extracted twice with 30 ml of hexane. The combined organic layers were washed with water, brine and then dried over anhydrous magnesium sulfate. After the solvent was evaporated under reduced pressure, the product was purified by silica-gel chromatography eluted with hexane to give 4.60 g of a colorless liquid (yield of 55%) MS: 558 $^1$H NMR (300 MHz, CDCl$_3$, ppm) δ 0.29 (12H, s, —Si(CH$_3$)$_2$), 0.80–0.90 (10H, m, —Si (CH$_3$)$_2$), 0.80–0.90 (10H, m, —SiCH$_2$— and —CH$_3$) 1.27–1.42 (40H, m,—(CH$_2$)$_{10}$—), 2.38 (6H, s), 7.18 (2H, s). Anal. Calcd for C$_{36}$H$_{70}$Si$_2$: C, 77.33; H, 12.62. Found: C, 77.16; H, 12.42.

Preparation of 2,5-bis(dimethyldodecylsilyl)-1,4-bisbromomethylbenzene 5.58 g (10.0 mmol) 2,5-bisdimethyldodecylsilyl-p-xylene, 3.92 g (22.0 mmol) NBS, a catalytic amount of benzoyl peroxide (BPO) and 100 ml of benzene were charged into a flask. The mixture was stirred at ambient temperature and irradiated by tungsten lamp for 2 hours. The solution was then washed three times with water, then with brine. The organic phase was dried over anhydrous magnesium sulfate. After filtration and evaporation of solvent, the crude product was purified by silica-gel chromoatography to give 3.36 g of a colorless liquid product (47% yield). MS: 716. FT-IR (KBr) ν$_{max}$/cm$^{-1}$3076, 2955, 2936, 2848, 1469, 1414, 1375, 1344, 1250, 1207, 1190, 1169, 1125, 1046, 1016, 973, 919, 904, 830, 790, 761, 720, 703, 682, 661, 650, 538, 502, 462, 440. $^1$H NMR (300 MHz, CDCl$_3$, ppm) δ 0.36 (12H, s, —Si(CH$_3$)$_2$), 0.85–1.04 (10H, m, —SiCH$_2$— and —CH$_3$), 1.16–1.46 (40H, m, —(CH$_2$)—Br), 4.47 (4H, s, —CH$_2$Br), 56 (2H, s). $^{13}$C NMR (300 MHz, CDCl$_3$, ppm) δ 142.1, 140.1, 137.6, 34.2, 33.4, 31.7, 29.6, 29.3, 29.2, 23.7, 22.6, 16.4, 13.9, −1.4. Anal. Calcd for C$_{36}$H$_{68}$Br$_2$Si$_2$: C, 60.31; H, 9.56; Br, 22.29; Found C, 60.52; H, 9.61; Br, 21.88.

Preparation of poly(2,5-bisdimethyldodecysilyl-1,4-phenylenevinylene) (DDS-PPV)

A solution of 1.07 g (1.5 mmol) 2,5-bis(dimethyldodecylsilyl)-1,4-bisbromomethylbenzene in 25 ml of anhydrous THF was charged in a 50 ml flask. To this solution was added dropwise 9.0 ml of a 1.0 M solution of potassium tert-butoxide (9.0 mmol) in anhydrous THF at room temperature with stirring. The mixture was continuously stirred for 24 hours. The reaction mixture was then poured into 300 ml of methanol with stirring. The resulting yellow precipitate was washed with deionized water and dried under vacuum. The crude polymer was redissolved in chloroform and reprecipitated in methanol twice. After extraction through Soxhlet with methanol and acetone for 12 hours successively, the polymer was dried under vacuum to afford 0.432 g of product. (52% yield). The molecular weight was measured by GPC to be $M_n$=152,600 and $M_w$=352,000 with a polydispersity index of 2.31. The quantum yield of the polymer in chloroform (ca $1 \times 10^{-6}$ M) was measured as high as 87%. FT-IR (KBr) $v_{max}$/cm$^{-1}$: 3057, 2926, 2855, 1467, 1250, 1194, 1164, 1106, 959, 835, 720, 642, 468, $^1$H NMR (300 MHz, CDCl$_3$, ppm) δ 0.31–0.53 (12H, s, —Si(CH$_3$)$_2$), 0.80–0.91 (6H, t, —CH$_3$), 0.91–1.06 (4H, br, —SiCH$_2$—), 1.16–1.44 (40H, br), 7.27–7.55 (2H, Br), 7.71–8.05 (2H, br, —CH=CH—). $^{13}$C NMR (300 MHz, CDCl$_3$, ppm) δ 151.9, 136.3, 128.1, 126.6, 33.6, 31.8, 29.6, 29.3, 24.1, 22.6, 16.6, 14.0, 1.4, 1.4. Anal. Calcd for (C$_{36}$H$_{66}$Si$_2$)$_n$: C, 77.90; H, 11.98. Found: C, 77.26; H, 11.65.

EXAMPLE 5

Preparation of 2,5-bisdimethyloctadecylsilyl-p-xylene

The Grignard reagent of 2,5-bisbromo-magnesium-p-xylene was prepared by refluxing a mixture of 7.92 g 2,5-disbromo-p-xylene (30.0 mmol) and 1.58 g magnesium turnings (66.0 mmol) in 60 ml of anhydrous THF for 4 hours (initiated by iodine). To this solution, cooled in an ice bath, was added a solution of dimethyloctadecylsilyl chloride (24.12 g, 66.0 mmol) in 40 ml of THF. The mixture was refluxed for 24 hours and then cooled in an ice bath. After it was quenched with saturated ammonium chloride aqueous solution, the THF was evaporated and the residue was extracted with 50 ml of hexane three times. The combined organic layers were washed with water, brine and then dried over anhydrous magnesium sulfate. After the solvent was evaporated under reduced pressure, the residue was purified by silica-gel chromatography eluted with hexane to afford 10.24 g of a white solid (yield 47%). M.p.: 55.0–57.0° C. MS: 726 $^1$H NMR (300 MHz, CDCl$_3$, ppm) δ 0.29 (12H, s, —Si(CH$_3$)$_2$), 0.80–0.85 (4H, t, —SiCH$_2$—), 0.87–0.91 (6H, t, —CH$_3$), 1.26–1.37 (64H, m, —(CH$_2$)$_{16}$—), 2.40 (6H, s), 7.20 (2H, s). Anal. Calcd for C$_{48}$H$_{94}$Si$_2$: C, 79.25; H, 13.02. Found: C, 79.03; H, 12.94.

Preparation of 2,5-bis(dimethyloctaadecylsilyl)-1,4-bisbromomethylbenzene 2.90 g (4.0 mmol) 2,5-bis(dimethyloctadecylsilyl)-p-xylene, 1.57 g (8.8 mmol) NBS, a catalytic amount of benzoyl peroxide (BPO) and 120 ml of benzene were charged into a 250 ml flask. The mixture was stirred at ambient temperature under tungsten light for 2 hours. The solution was then washed three times with water then brine. The organic phase was dried over anhydrous magnesium sulfate. After filtration and evaporation of solvent, the residue was purified by silica-gel chromatography eluted by hexane to afford 1.56 g of a white solid (yield 44%). M.p.: 67.5–69.0° C. 884. FT-IR (cm$^{-1}$): 3075, 2948, 2929, 2848, 1469, 1413, 1343, 1249, 1208, 1191, 1168, 1126, 1023, 1010, 980, 947, 910, 842, 826, 789, 753, 755, 719, 702, 682, 659, 649, 538, 482, 458, 439. $^1$H NMR (300 MHz, CDCl$_3$, ppm) δ 0.38 (12H, s, —Si(CH$_3$)$_2$), 0.85–0.88 (10H, m, —SiCH$_2$—, —CH$_3$), 1.25–1.30 (64H, m, —(CH$_2$)$_{16}$—), 4.58 (4H, s, —CH$_2$Br), 7.49 (2H, s); $^{13}$C NMR (300 MHz, CDCl$_3$, ppm) δ 142.2, 140.1, 137.5, 34.2, 33.5, 31.8, 29.6, 29.3, 29.2, 23.8, 22.6, 16.4, 14.0, -1.6. Anal. Calcd for C$_{48}$H$_{92}$Br$_2$Si$_2$: C, 64.13; H, 10.48; Br, 18.05; Found: C, 64.56; H, 10.89; B, 17.63.

Preparation of poly(2,5-bisdimethyloctadecylsilyl-1,4-phenylenevinylene) (ODS-PPV)

A solution of 1.33 g (1.50 mmol) 2,5-bisdimethyloctadecylsilyl-1,4-bisbromomethylbenzene in 25 ml of anhydrous THF was charged into a 50 ml flask. To this stirred solution was added 9.0 ml of a 1.0 M solution of potassium tert-butoxide (9.0 mmol) in anhydrous THF at room temperature. The mixture was continuously stirred for 24 hours. The reaction mixture was then poured into 200 ml of methanol with stirring. The resulting precipitate was redissolved in chloroform and reprecipitated twice, then followed by extraction through a Soxhlet extractor with methanol for 12 hours and finally dried under vacuum to afford 0.634 g of a yellow-green solid (59% yield). The molecular weight was measured by GPC to be $M_n$=227,700 and $M_w$=416,900 with a polydispersity index of 1.83. The quantum yield of the polymer in chloroform (ca $1 \times 10^{-6}$ M) was measured as high as 89%. FT-IR (KBr) $v_{max}$/cm$^{-1}$: 3044, 2961, 2923, 2855, 1467, 1410, 1250, 1194, 1164, 1107, 1078, 959, 836, 769, 720, 641, 464. $^1$H NMR (300 MHz, CDCl$_3$, ppm) δ 0.24–0.71 (12H, s), 0.71–1.06 (10H, br), 1.06–1.45 (64H, br), 7.32–7.58 (2H, br), 7.66–8.03 (2H, b, —CH=CH—). $^{13}$C NMR (300 MHz, CDCl$_3$, ppm) (C, 79.70); H), δ 151.9, 136.2, 128.2, 126.5, 33.7, 31.9, 29.7, 29.3, 24.1, 22.6, 16.7, 14.0, -1.4. Anal Calcd for (C$_{48}$H$_{90}$Si$_2$)$_n$: 12.54. Found: C, 7970; H, 12.18.

EXAMPLE 6

Preparation of 2-(decyldimethylsilyl)-1,4-bisbromomethylbenzene 3.04 g (10.0 mmol) 2-decyldimethylsilyl-p-xylene, 3.92 g (22.0 mmol) NBS, a catalytic amount of benzoyl peroxide (BPO) and 100 ml of benzene were charged into a flask. The mixture was stirred at ambient temperature and irradiated by a tungsten lamp for 2 hours. The solution was then washed three times with water then with brine. The organic phase was dried over anhydrous magnesium sulfate. After filtration and evaporation of solvent the crude product was purified by silica-gel chromatography to give 2.22 g of a colorless liquid (48% yield). MS: 462. FT-IR (KBr) $v_{max}$/cm$^{-1}$3075, 2955, 2936, 2848, 1470, 1412, 1375, 1345, 1251, 1207, 1190, 1168, 1125, 1047, 1015, 973, 919, 904, 831, 790, 761, 720, 703, 682, 661, 650, 538, 502, 462. $^1$H NMR (300 MHz, CDCl$_3$, ppm) δ 0.38 (6H, s, —Si(CH$_3$)$_2$), 0.86–1.06 (5H, m, —SiCH$_2$— and —CH$_3$), 1.16–1.46 (16H, m, —(CH$_2$)$_8$—), 4.47 (2H, s), 4.62 (2H, s), 7.42 (2H, s), 7.49 (1H, s). Anal. Calcd. C$_{20}$H$_{34}$Br$_2$Si: C, 51.95; H, 7.41; Br, 34.56; Found: C, 51.52; H, 7.61; Br, 33.98.

Preparation of poly(2-decyldimethylsilyl-1,4 phenylenevinylene) (mDS-PPV)

A solution of 1.16 g (2.50 mmol) 2-decyldimethylsilyl-1,4-bisbromomethylebenzene in 40 ml of anhydrous THF was charged into a 100 ml flask. To this stirred solution was added 15.0 ml of a 1.0 M solution of potassium tert-butoxide (15.0 mmol) in anhydrous THF at room temperature. The mixture was continuously stirred for 24 hours. The reaction mixture was then poured into 200 ml of methanol with stirring. The resulting precipitate was dissolved in chloroform and reprecipitated in methanol twice, followed by extraction through a Soxhlet extractor with methanol for 12 hours and vacuum dried to afford 0.413 g of a yellow-green solid (55% yield). The molecular weight was measured by GPC to be $M_n$=48,800 and $M_w$=87,100 with a polydispersity of 1.78. The quantum yield of the polymer in chloroform (ca $1\times10^{-6}$ M) was measured as high as 87%. FT-IR (KBr) $v_{max}$/cm$^{-1}$: 3047, 2955, 2922, 2855, 1467, 1410, 1377, 1251, 1194, 1164, 1106, 1079, 960, 836, 769, 721, 641, 464. $^1$H NMR (300 MHz, CDCl$_3$, ppm) δ 0.24–0.66 (6H, s), 0.73–1.05 (5H, br), 1.06–1.45 (16H, br), 7.28–7.58 (3H, br), 7.66–8.01 (2H, br, —CH=CH—). Anal. Calcd for $(C_{20}H_{32}Si)_n$: C, 79.92; H, 10.73; Found: C, 79.45; H, 10.38.

EXAMPLE 7

Preparation of 2-dimethyldodecylsilylthiophene

The Grignard reagent of 2-bromothiophene was prepared by refluxing a mixture of 2-bromothiophene (4.89 g, 30.0 mmol) and magnesium turnings (0.80 g, 33.0 mmol) in 50 ml of anhydrous THF for 5 hours. To this solution, cooled in an ice bath, was added a solution of dimethyldodecylsilyl chloride (8.68 g, 33.0 mmol) in 40 ml THF. The mixture was refluxed for 24 hours and then cooled down. After being quenched with saturated ammonium chloride aqueous solution, the THF was evaporated and the residue extracted with 30 ml of hexane three times. The combined organic layers were washed with water and brine and then dried over anhydrous magnesium sulfate. After the solvent was evaporated, the residue was purified by silica-gel chromatography eluted with hexane to afford 6.62 g of a colorless liquid (yield 71%) $^1$H NMR (300 MHz, CDCl$_3$, ppm): δ 0.30 (6H, s, —Si(CH$_3$)$_2$), 0.81–0.85 (2H, t, —SiCH$_2$—), 0.87–0.91 (3H, t, —CH$_3$), 1.25–1.34 (20H, m, —(CH$_2$)$_{10}$—), 7.15–7.19 (2H, 7.57–7.60 (H, d, Th-H). Anal. Calcd for $C_{18}H_{34}$SSi: C, 69.60; H, 11.03; S, 10.32. Found C, 69.74; H, 10.89; S, 9.83.

Preparation of 2,5-bis(5'-dimethyldodecylsilylthienyl)-p-xylene

Into a 250 ml flask containing a solution of 2-dimethyldodecylsilylthiophene (7.45 g, 24.0 mmol) in 50 ml of THF was added 21.8 ml of solution of n-BuLi (1.1 M in hexane, 24.0 mmol) under the protection of nitrogen. The reaction mixture was stirred at −15° C. for 1 hour and then was added to the solution of magnesium bromide (freshly prepared from magnesium turnings (0.67 g, 28 mmol) and 1,2-dibromoethane (4.69 g, 25 mmol) in 40 ml of THF at −60° C.). After stirring for 0.5 h, the mixture was allowed to warm slowly to room temperature and then was added dropwise to a solution of 2,5-dibromo-p-xylene (2.22 g, 12.0 mmol) and Ni(dppp)Cl$_2$ (66 mg, 0.12 mmol) in 30 ml THF at room temperature. The reaction mixture was stirred for 12 hours at room temperature and for 24 hours under reflux, then quenched with saturated ammonium chloride aqueous solution. After the mixture was extracted with hexane, the combined organic layer was washed with water and brine and dried over anhydrous magnesium sulfate. After the solvent was removed by evaporation, the residue was purified by silica-gel chromatography eluted with hexane to afford 3.64 of a colorless liquid (yield 42%). MS: 722. $^1$H NMR (300 MHz, CDCl$_3$, ppm): δ 0.34 (12H, s, —Si(CH$_3$)$_2$), 0.81–0.86 (4H, t, —SiCH$_2$—), 0.87–0.93 (6H, t, —CH$_3$), 1.26–1.36 (40H, m, —(CH$_2$)$_{10}$—), 2.41 (6H, s, —CH$_3$) 6.94 (2H, d, aromatic H), 7.04 (2H, d, aromatic H), 7.20 (2H, m, aromatic H). Anal. Calcd for $C_{44}H_{74}S_2Si_2$: C, 73.06; H, 10.31; S, 8.86. Found: C, 72.88; H, 10.06; S, 8.49.

Preparation of 2,5-bis(5'-dimethyldodecylsilylthienyl)-1,4-bisbromomethylbenzene 2.89 g (4.0 mmol) 2,5-bis(5'-dimethyldodecylsilylthienyl)-p-xylene, 0.78 g (4.4 mmol) NBS, a catalytic amount of benzoyl peroxide (BPO) and 40 ml of benzene were charged in a 100 ml flask. The mixture was stirred at room temperature under tungsten light for 4 hours. The solution was then washed three times with water then with brine and dried over anhydrous magnesium sulfate. After the solvent was evaporated, the residue was purified by silica-gel chromatography eluted with hexane to afford 1.51 g of a colorless liquid (yield 43%). FT-IR (KBr, cm$^{-1}$): 3057, 2922, 2854, 1491, 1462, 1433, 1406, 1250, 1217, 1072, 1007, 974, 841, 812, 785, 766, 654, 598, 534, 499. $^1$H NMR (300 MHz, CDCl$_3$, ppm): δ 0.36 (6H, s, —Si(CH$_3$)$_2$), 0.80–0.92 (10H, m, —SiCH$_2$—, —CH$_3$), 1.24–1.34 (40H, m, —(CH2)$_{10}$—), 4.48 (4H, d, —CH$_2$Br), 7.24 (2H, d), 7.32 (2H, d), 7.50 (2H, s). Anal. Calcd for $C_{44}H_{72}Br_2S_2Si_2$: C, 59.98; H, 8.24; Br, 18.14; S, 7.28; Found: C, 59.66; H, 8.35; Br, 17.92; S, 7.46.

Preparation of poly(2,5-bis (5'dimethyldodecylsilylthienyl)-1,4-phenylenevinylene) (DDSth-PPV)

A solution of 1.76 g (2.0 mmol) 2,5-bis (5'dimethyldodecylsilylthienyl)-1,4-bisbromomethylbenzene in 100 ml of anhydrous THF was charged in a 250 ml flask. To this stirred solution was added dropwise of a 8 ml of 1.0 M solution of potassium tert-butoxide (8.0 mmol) in THF at room temperature. The mixture was stirred for 4 hours, and then the reaction mixture was poured into 300 ml of methanol with stirring. The resulting yellow precipitate was collected and then dissolved in chloroform and reprecipitated in methanol twice more. The product was extracted through a Soxhlet extractor with methanol and acetone for 12 hours successively and dried under vacuum to afford 0.81 g of a yellow solid (56% yield). The molecular weight was measured by GPC to be $M_n$=32,400 and $M_w$=68,000 with a polydispersity index of 2.10. The quantum yield of the polymer in chloroform (ca $1\times10^{-6}$ M) was measured as high as 74%. FT-IR (KBr, cm$^{-1}$): 3047, 3023, 2922, 2852, 1597, 1495, 1461, 1439, 1405, 1251, 1204, 1072, 1009, 961, 891, 828, 811, 695, 626, 469. $^1$H NMR (300 MHz, CDCl$_3$, ppm): δ 0.34 (12H, s, —Si(CH$_3$)$_2$) 0.85 (10H, br, —SiCH$_2$— and —CH$_3$), 1.25 (40H, br, (CH$_2$)$_{10}$—), 7.03–7.45 (6H, m, aromatic H), 7.50–7.64 (2H, —CH=CH—). Anal. Calcd for $(C_{44}H_{70}S_2Si_2)_n$: C, 73.47; H, 9.81; S, 8.91; Found: C, 73.66; H, 9.70; S, 8.53.

EXAMPLE 8

Preparation of 2-(5'-dimethyldodecylsilylthienyl)-p-xylene

Into a 250 ml flask containing a solution of 2-dimethyldodecylsilylthiophene (6.21 g, 20.0 mmol) in 50 ml of THF was added 18.2 ml of a solution of n-Buli (1.1 M in hexane, 20.0, mmol) under the protection of nitrogen. The reaction mixture was stirred at −15° C. for 1 h and then was added to the solution of the magnesium bromide, (freshly prepared from magnesium turnings (0.58 g, mmol) and 1,2-dibromoethane (4.13 g, 22 mmol) in 40 ml of THF at −60° C.). After stirring for 0.5 h, the mixture was allowed to warm slowly to room temperature and then was added dropwise to a solution of 2-bromo-p-xylene (3.70 g, 20.0 mmol) and Ni(dppp)Cl$_2$ (0.11 g, 0.2 mmol) in 30 ml of THF at room temperature. The reaction mixture was continuously stirred for 12 hours at room temperature and for 24 hours under reflux, and then quenched with saturated ammonium chloride aqueous solution. After the mixture was extracted with hexane, the combined organic layers were washed with water and brine, dried over anhydrous magnesium sulfate, and the solvent removed by evaporation. The residue was purified by silica-gel chromatography eluted with hexane to afford 4.40 g of a colorless liquid (yield 53%). $^1$H NMR (300 MHz, CDCl$_3$, ppm) δ 0.33 (6H, s, —Si(CH$_3$)$_2$), 0.81 (2H, t, —SiCH$_2$), 0.86–0.91 (3H, t, —CH$_3$), 1.26 (20H, m, —(CH$_2$)$_{10}$—), 2.34–2.40 (6H, d, —CH$_3$), 6.92–7.21 (5H, m, aromatic H). Anal. Calcd for C$_{26}$H$_{42}$SSi, 75.29; H, 10.21; S, 7.73. Found: C, 75.02; H, 9.76; S, 7.49.

Preparation of 2-(5'-dimethyldodecylsilylthienyl), 1,4-bisbromomethylbenzene 2.08 g (5.0 mmol) 2-(5'-dimethyldodecylsilylthienyl)-p-xylene, 1.96 g (11.0 mmol) NBS, a catalytic amount of benzoyl peroxide (BPO) and 120 ml of benzene were charged in a 250 ml flask. The mixture was stirred at room temperature under tungsten light for 4 hours. The solution was washed with water three times and then washed with brine and dried over anhydrous magnesium sulfate. After the solvent was evaporated, the residue was purified through silicon-gel chromatography eluted with hexane to afford 1.32 g of colorless liquid (yield 46%). FT-IR (KBr, cm$^{-1}$): 3057, 2919, 2850, 1491, 1462, 1433, 1406, 1248, 1217, 1072, 1007, 974, 841, 812, 785, 766, 654, 598, 499, 442. $^1$H NMR (300 MHz, CDCl$_3$ ppm): δ 0.34 (6H, s, —Si(CH$_3$)$_2$), 0.81–0.85 (2H, t, —SiCH$_2$—), 0.86–0.91 (3H, t, —CH$_3$), 1.25–1.34 (20H, m, —(CH$_2$)$_{10}$—), 4.48–4.58 (4H, d, —CH$_2$Br), 7.24–7.51 (H, m, aromatic H). Anal. Calcd for C$_{26}$H$_{40}$Br$_2$SSi: C, 54.54; H, 7.04; Br, 27.91: S, 5.60. Found: C, 54.12; H, 7.39; Br, 28.64; 4.92.

Preparation of poly(2-(5'-dimethyldodecylsilylthienyl)-1,4-phenylenevinylene) (mDDDth-PPBV)

A solution of 1.14 g (2.0 mmol) 2-(5'dimethyldodecylsilythienyl)-1,4-bisbromomethylbenzne in 100 ml of anhydrous THF was charged in a 250 ml flask. To this stirred solution was added dropwise of 8 ml of a 1.0 M solution of potassium tert-butoxide (8.0 mmol) in THF at room temperature. The mixture was stirred for 4 hours. The reaction mixture was poured into 300 ml of methanol with stirring. The resulting yellow precipitate was collected and then dissolved in chloroform and reprecipitated in methanol twice more. The polymer was purified by extraction through a Soxhlet extractor with methanol and acetone for 12 hours successively and dried under vacuum to afford 0.43 g (52% yield) of a yellow polymer. The molecular weight was measured by GPC to be M$_n$=39,400 M$_w$=83,200 with a polydispersity index of 2.11. The quantum yield of the polymer in chloroform (ca 1×10$^{-6}$ M) was measured as high as 73%. FT-IR (KBr, cm$^{-1}$): 3048, 3023, 2923, 2852, 1597, 1495, 1462, 1439, 1405, 1250, 1204, 1073, 1009, 960, 891, 828, 808, 695, 627, 469. $^1$H NMR (300 MHz, CDCl$_3$, ppm): δ 0.34 (6H, s, Si(CH$_3$)$_2$), 0.85 (5H, br, —SiCH$_2$— and CH$_3$), 1.25 (20H, br, —(CH$_2$)$_{10}$—), 7.03–7.45 (5H, m, aromatic H), 7.50–7.64 (2H, br, —CH═CH). Anal. Calcd for (C$_{26}$H$_{38}$SSi)$_n$: C, 76.03; H, 9.33; Found: C, 76.30; H, 9.11; S, 8.35.

EXAMPLE 9

Light-emitting diodes were fabricated with DS-PPV using ITO as the anode and magnesium-silver as the cathode; i.e. ITO/DS-PPV/Mg:Ag. The DS-PPV film was spin-cast from toluene solution (1%, w/v). The thickness of the film was about 60 nm. 200 nm-thick Mg:Ag (10:1 by mass) cathode was vacuum deposited onto the DS-PPV film at a pressure below 5×10$^{-4}$ Pa. The active area was 0.06 cm$^2$ as defined by cathode. Bright green light emission was observed above the forward bias (ITO wired positive) of 7.5 V and reached the brightness of 100 cd/m$^2$ at 33 mA/cm$^2$ for a bias of 12 V. The EL spectrum peaked at 508 nm. The maximum current efficiency was measured to be around 0.3 cd/A and power efficiency was about 0.09 1 m/W (11 V).

EXAMPLE 10

A light-emitting diode was fabricated with a 30 nm thick film of PEDOT:PSS as a hole injection/transporting layer between the anode (ITO) and DS-PPV layer, which was spin coated on the ITO from a water dispersion and then baked at 105° C. for 20 min, i.e. in the configuration of ITO/PEDOT:PPS/DS-PPV/Mg:Ag. The device turned on at 4V and reached the brightness of 100 cd/m$^2$ at 19 mA/cm$^2$ for a bias of 6.5V. At the bias of 12 V, the brightness reached to ~3600 cd/m$^2$. The maximum current efficiency and power efficiency are 2.3 cd/A, 0.65 1 m/W (11 V), respectively. The EL emissive spectrum was measured as shown in FIG. 2 and corresponding luminance and current density versus the bias voltage are demonstrated in FIG. 3 for both the double layer device and the single layer device described in Example 9. The EL spectrum peaked at 508 nm with the full width at the half maximum (FWHM) of 50 nm, which corresponds to sharp and pure green color.

EXAMPLE 11

A device was fabricated using Alq3 as electron transporting layer between DS-PPV and magnesium: silver, i.e. in the configuration of ITO/DS-PPV/Alg3/Mg:Ag. The device turned on at 7 V and reached the brightness of 1320 cd/m$^2$ at a bias voltage of 16 V. The external EL quantum efficiencies are 0.2%. The EL spectrum was similar to that obtained in Example 10.

While the present specification employs the term "comprises" in certain instances in identifying one or more constituents of certain elements and features without limitation as to the presence or absence of other constituents, the use of this term is not a disclaimer of elements and features consisting of only the recited constituents.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilized for realizing the invention in diverse forms thereof.

What is claimed is:

1. A compound according to formula (I),

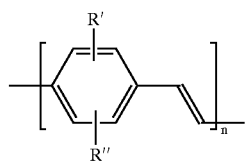 (I)

wherein R' is $Ar_1SiR_1R_2R_3$ and R" is $AR_2SiR_4R_5R_6$;

$R_1$, $R_2$, $R_3$, $R_4$, $R_5$, and $R_6$ are independently selected from the group consisting of hydrogen, alkyl, alkenyl, alkynyl, aryl, cycloalkyl, cycloalkenyl, cycloalkynyl, arylalkyl, arylalkenyl, and arylalkynyl;

$Ar_1$ and $Ar_2$ are independently selected from the group consisting of arylene, arylenealkylene, arylenealkynylene, heteroarylene, heteroarylenealkylene, heteroarylenealkenylene, and heteroarylenealkynylene; and n is at least 20.

2. The compound according to claim 1, wherein n is from about 50 to about 10,000.

3. The compound according to claim 1, wherein n is from about 100 to about 2,000.

4. The compound according to claim 1,
wherein $R_1$, $R_2$, $R_3$, $R_4$, $R_5$, $R_6$ are independently selected from the group consisting of hydrogen, $C_1$–$C_{20}$ alkyl, $C_1$–$C_{20}$ alkenyl, $C_1$–$C_{20}$ alkynyl, $C_6$–$C_{30}$ aryl, $C_3$–$C_{30}$ cycloalkyl, $C_4$–$C_{30}$ cycloalkenyl, $C_4$–$C_{30}$ cycloalkynyl, $C_7$–$C_{40}$ arylalkyl, $C_7$–$C_{40}$ arylalkenyl, and $C_7$–$C_{40}$ arylalkynyl; and $Ar_1$ and $Ar_2$ are independently selected from the group consisting of $C_6$–$C_{30}$ arylene, $C_6$–$C_{30}$ arylenealkylene, $C_6$–$C_{30}$ arylenealkynylene, $C_6$–$C_{30}$ heteroarylene, $C_6$–$C_{30}$ heteroarylenealkylene, $C_6$–$C_{30}$ heteroarylenealkenylene, and $C_6$–$C_{30}$ heteroarylenealkylene.

5. The compound according to claim 1, wherein R' and R" are attached at $C_2$–$C_3$, $C_2$–$C_5$, or $C_2$–$C_6$ positions of the compound.

6. The compound according to claim 1, wherein R' and R" are attached at the $C_2$–$C_5$ positions.

7. The compound according to claim 1, wherein $Ar_1$ and $Ar_2$ are thiophenyl.

8. The compound according to claim 1, wherein $R_1$, $R_2$, $R_3$, $R_4$, $R_5$, and $R_6$ are alkyl.

9. The compound according to claim 1, wherein $R_1$, $R_2$, $R_4$, and $R_5$ are methyl.

10. The compound according to claim 1, wherein $R_3$ and $R_6$ are selected from the group consisting of methyl, butyl, decyl, octadecyl, and dodecyl.

11. A solution comprising a solvent and a compound according to formula (I),

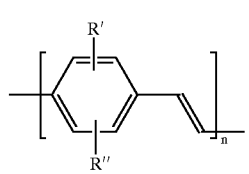 (I)

wherein R' is $Ar_1SiR_1R_2R_3$ and R" is $Ar_2SiR_4R_5R_6$;

$R_1$, $R_2$, $R_3$, $R_4$, $R_5$, and $R_6$ are independently selected from the group consisting of hydrogen, alkyl, alkenyl, alkynyl, aryl, cycloalkyl, cycloalkenyl, cycloalkynyl, arylalkyl, arylalkenyl, and arylalkynyl;

$Ar_1$ and $Ar_2$ are independently selected from the group consisting of arylene, arylenealkylene, arylenealkynylene, heteroarylene, heteroarylenealkylene, heteroarylenealkenylene, and heteroarylenealkynylene; and n is at least 20.

12. The solution according to claim 11, wherein the solvent is selected from the group consisting of tetrahydrofuran, chloroform, 1,1,2,2-tetrachloroethylene, toluene, and xylene.

13. A method of making a compound according to formula (I),

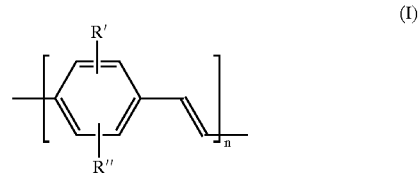 (I)

wherein R' is $Ar_1SiR_1R_2R_3$ and R" is $Ar_2SiR_4R_5R_6$;

$R_1$, $R_2$, $R_3$, $R_4$, $R_5$, and $R_6$ are independently selected from the group consisting of hydrogen, alkyl, alkenyl, alkynyl, aryl, cycloalkyl, cycloalkenyl, cycloalkynyl, arylalkyl, arylalkenyl, and arylalkynyl;

$Ar_1$ and $Ar_2$ are independently selected from the group consisting of arylene, arylenealkylene, arylenealkynylene, heteroarylene, heteroarylenealkylene, heteroarylenealkenylene, and heteroarylenealkynylene;

and n is at least 20.

14. A method of making a polymer light-emitting diode (PLED), comprising:

providing a first conductive layer;

depositing an emissive layer comprising a compound of formula (I)

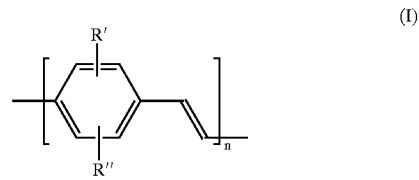 (I)

onto the first conductive layer, wherein R' is $Ar_1SiR_1R_2R_3$ and R" is $Ar_2SiR_4R_5R_6$; $R_1$, $R_2$, $R_3$, $R_4$, $R_5$, and $R_6$ are independently selected from the group consisting of hydrogen, alkyl, alkenyl, alkynyl, aryl, cycloalkyl, cycloalkenyl, cycloalkynyl, arylalkyl, arylalkenyl, and arylalkynyl; $Ar_1$ and $Ar_2$ are independently selected from the group consisting of arylene, arylenealkylene, arylenealkynylene, heteroarylene, heteroarylenealkylene, heteroarylenealkenylene, and heteroarylenealkynylene; and n is at least 20; and depositing a second conductive layer onto the emissive layer.

15. The method according to claim 14, wherein depositing an emissive layer comprising a compound of formula (I) comprises spin coating the emissive layer.

16. A polymer light-emitting diode (PLED) comprising an emitter that comprises a compound according to formula (I),

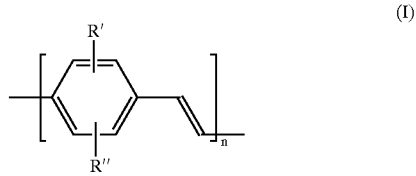

(I)

wherein R' is $Ar_1SiR_1R_2R_3$ and R" is $Ar_2SiR_4R_5R_6$;

$R_1$, $R_2$, $R_3$, $R_4$, $R_5$, and $R_6$ are independently selected from the group consisting of hydrogen, alkyl, alkenyl, alkynyl, aryl, cycloalkyl, cycloalkenyl, cycloalkynyl, arylalkyl, arylalkenyl, and arylalkynyl;

$Ar_1$ and $Ar_2$ are independently selected from the group consisting of arylene, arylenealkylene, arylenealkynylene, heteroarylene, heteroarylenealkylene, heteroarylenealkenylene, and heteroarylenealkynylene; and n is at least 20.

17. The PLED according to claim 16, wherein the emitter is an emissive layer interposed between a first conductive layer and a second conductive layer.

18. The PLED according to claim 17, wherein the first conductive layer is on a substrate.

19. The PLED according to claim 18, wherein the substrate is glass or plastic.

20. The PLED according to claim 17, wherein the first conductive layer is an anode and the second conductive layer is a cathode.

21. The PLED according to claim 20, wherein the cathode comprises a reflective metal or a semitransparent conductor.

22. The PLED according to claim 20, wherein the cathode comprises calcium, magnesium, aluminum, silver or indium, or an alloy thereof.

23. The PLED according to claim 20, wherein the anode comprises indium tin oxide (ITO) or polyaniline (PANI).

24. The PLED according to claim 20, further comprising a hole injection/transporting layer interposed between the anode and the emissive layer.

25. The PLED according to claim 24, wherein the hole injection/transporting layer comprises copper phthalocyanine (CuPC), polyaniline (PANI), or poly(3,4-ethylenedioxy-thiophene) (PEDOT).

26. The PLED according to claim 20, further comprising an electron injection/transporting layer interposed between the cathode and the emissive layer.

27. The PLED according to claim 26, wherein the electron injection/transporting layer comprises 8-hydroxyquinoline aluminum (Alq3), a 1,3,4-oxadiazole, a 1,3,4-oxadiazole-containing polymer, a 1,3,4-triazole, a 1,3,4-triazoles-containing polymer, a quinoxaline-containing polymer, copper phthalocyanine, or a cyano-poly(phenylenevinylene) (CN-PPV).

28. The solution according to claim 11, wherein each of $Ar_1$ and $Ar_2$ are thiophenyl.

29. The method according to claim 13, wherein each of $Ar_1$ and $Ar_2$ are thiophenyl.

30. The method according to claim 14, wherein depositing the emissive layer comprising the compound of formula (I) comprises providing the compound of formula (I) wherein each of $Ar_1$ and $Ar_2$ are thiophenyl.

31. The PLED according to claim 16, wherein each of $Ar_1$ and $Ar_2$ are thiophenyl.

* * * * *

UNITED STATES PATENT AND TRADEMARK OFFICE
CERTIFICATE OF CORRECTION

PATENT NO. : 6,885,038 B2  
APPLICATION NO. : 10/174543  
DATED : April 26, 2005  
INVENTOR(S) : Wei Huang, Zhikuan Chen and Soo Jin Chua It is certified that error appears in the above-identified patent and that said Letters Patent is hereby corrected as shown below:

On the title page:

In the section (56) References Cited:   change "Spreitzer, Hubert, et al., Soluble Phelyl-Subsituted PPVS—" to --Spreitzer, Hubert, et al., Soluble Phenyl-Subsituted PPVS—--

In the section (57) Abstract:   change "het-eroarylenealkylene;" to --heteroarylenealkynylene;--

In the specification:

| | | |
|---|---|---|
| COLUMN 2, | LINE 38, | change "poly(2-decyldimethylsilly-1,4-phenylenevinylene)," to --poly(2-decyldimethylsilyl-1,4-phenylenevinylene),-- |
| COLUMN 3, | LINE 23, | change "1,3,4-triazoles-containing" to --1,3,4-triazole-containing-- |
| COLUMN 5, | LINE 10, | change "KOBu$^1$" to --KOBu$^t$-- |
| COLUMN 5, | LINE 43, | change "be bromination" to --be brominated-- |
| COLUMN 5, | LINE 67, | after "may" and before "dried" insert --be-- |
| COLUMN 6, | LINE 10, | change "KOBu$^1$" to --KOBu$^t$-- |
| COLUMN 9, | LINES 56-57, | change "1,3,4-triazoles-containing" to --1,3,4-triazole-containing-- |
| COLUMN 10, | LINE 19, | change "maybe prepared" to --may be prepared-- |
| COLUMN 11, | LINE 18, | change "g of 2,5-bistrimethysily-p-xylene (4.0 mmol)," to --4.0 mmol of 2,5-bistrimethysily-p-xylene,-- |
| COLUMN 13, | LINE 21, | change "water, brine" to --water and brine-- |
| COLUMN 13, | LINE 24, | change "gelchromatorgraphy" to --gel chromatography-- |

UNITED STATES PATENT AND TRADEMARK OFFICE
CERTIFICATE OF CORRECTION

PATENT NO. : 6,885,038 B2
APPLICATION NO. : 10/174543
DATED : April 26, 2005
INVENTOR(S) : Wei Huang, Zhikuan Chen and Soo Jin Chua It is certified that error appears in the above-identified patent and that said Letters Patent is hereby corrected as shown below:

In the specification (continued):

| | | |
|---|---|---|
| COLUMN 14, | LINE 34, | change "water, brine" to --water and brine-- |
| COLUMN 14, | LINE 55, | change "chromoatography" to --chromatography-- |
| COLUMN 15, | LINE 45, | change "water, brine" to --water and brine-- |
| COLUMN 16, | LINE 67, | change "1,4-bisbromomethylebenzene" to --1,4-bisbromomethylbenzene-- |
| COLUMN 18, | LINE 4, | change "—$CH_{3)}$," to --—$CH_3$),-- |
| COLUMN 18, | LINE 55, | change "—$CH_{3)}$," to --—$CH_3$),-- |
| COLUMN 18, | LINE 66, | change "n-Buli" to --n-BuLi-- |
| COLUMN 19, | LINE 63, | after "$M_n$=39,400" and before "$M_w$=83,200" insert --and-- |
| COLUMN 20, | LINE 13, | change "about 60 nm. 200 nm-thick Mg:Ag" to --about 60 nm. A 200 nm-thick Mg:Ag-- |
| COLUMN 20, | LINE 17, | after "by" and before "cathode" insert --the-- |
| COLUMN 20, | LINE 48, | change "magnesium:silver:" to --magnesium-silver-- |
| COLUMN 20, | LINE 55, | change "identifying one of more" to --identifying one or more-- |

In the claims:

| | | | |
|---|---|---|---|
| CLAIM 1, | COLUMN 21, | LINE 12, | change "$AR_2SiR_4R_5R_6$;" to -- $Ar_2SiR_4R_5R_6$;-- |
| CLAIM 7, | COLUMN 21, | LINE 44, | after "wherein" and before "$Ar_1$" insert --each of-- |
| CLAIM 22, | COLUMN 23, | LINE 34, | change "aluminum, silver or indium," to -- aluminum, silver, or indium--, |

UNITED STATES PATENT AND TRADEMARK OFFICE
CERTIFICATE OF CORRECTION

PATENT NO. : 6,885,038 B2
APPLICATION NO. : 10/174543
DATED : April 26, 2005
INVENTOR(S) : Wei Huang, Zhikuan Chen and Soo Jin Chua It is certified that error appears in the above-identified patent and that said Letters Patent is hereby corrected as shown below:

In the claims (continued):
CLAIM 27, COLUMN 24, LINES 18-19, change "1,3,4-triazoles-containing" to --1,3,4-triazole-containing--

Signed and Sealed this

Ninth Day of January, 2007

JON W. DUDAS
*Director of the United States Patent and Trademark Office*